(12) United States Patent
Boecherer

(10) Patent No.: US 11,768,242 B1
(45) Date of Patent: Sep. 26, 2023

(54) ANALYZER AND METHOD FOR REGULATIONS TESTING OF A SOLAR INSTALLATION

(71) Applicant: Fluke Corporation, Everett, WA (US)

(72) Inventor: Ulrich Boecherer, Freiamt (DE)

(73) Assignee: Fluke Corporation, Everett, WA (US)

( * ) Notice: Subject to any disclaimer, the term of this patent is extended or adjusted under 35 U.S.C. 154(b) by 0 days.

(21) Appl. No.: 18/072,580

(22) Filed: Nov. 30, 2022

Related U.S. Application Data

(60) Provisional application No. 63/402,887, filed on Aug. 31, 2022.

(51) Int. Cl.
    *G01R 31/327* (2006.01)
    *G01R 31/3842* (2019.01)

(52) U.S. Cl.
    CPC ..... *G01R 31/3277* (2013.01); *G01R 31/3842* (2019.01)

(58) Field of Classification Search
    None
    See application file for complete search history.

(56) References Cited

U.S. PATENT DOCUMENTS

| 5,315,252 A | 5/1994 | Puetz et al. |
| 6,988,061 B2 | 1/2006 | Gray et al. |

| 2012/0049855 A1 | 3/2012 | Crites | |
| 2015/0346268 A1* | 12/2015 | Yamashita | G01R 31/1272 324/551 |
| 2016/0103172 A1* | 4/2016 | Yamashita | G01R 31/2812 324/754.07 |

(Continued)

FOREIGN PATENT DOCUMENTS

| CN | 101592714 A | 12/2009 |
| CN | 104617876 A | 5/2015 |
| CN | 111599710 A | 8/2020 |

(Continued)

OTHER PUBLICATIONS

Dunlop et al., "Standards for the assessment of the environmental performance of photovoltaic modules, power conversion equipment and photovoltaic systems," Joint Research Center, 2018, 92 pages.

(Continued)

*Primary Examiner* — Jas A Sanghera
(74) *Attorney, Agent, or Firm* — SEED INTELLECTUAL PROPERTY LAW GROUP LLP

(57) ABSTRACT

A test device for testing an electrical circuit includes input terminals connectable by test leads to different test points of the electrical circuit; at least first and second measurement circuits; switches; a processor; and a storage medium storing instructions that, when executed by the processor, cause the test device to perform a first test of the electrical circuit while one or more of the switches electrically couples at least first and second ones of the input terminals to the first measurement circuit, and perform a second test of the electrical circuit while one or more of the switches electrically couples at least third and fourth ones of the input terminals the second measurement circuit, where the first and second tests are performed without changing connections of the input terminals of the test device to the different test points of the electrical circuit.

17 Claims, 13 Drawing Sheets

(56) References Cited

U.S. PATENT DOCUMENTS

2016/0329715 A1    11/2016  Orr et al.

FOREIGN PATENT DOCUMENTS

| CN | 212935850 U | 4/2021 |
| CN | 114755118 A | 7/2022 |
| KR | 20140104692 A | 8/2014 |

OTHER PUBLICATIONS

International Search Report and Written Opinion, dated Jun. 15, 2023, for International Patent Application No. PCT/US2023/062074. (13 pages).

* cited by examiner

ANALYZER AND METHOD FOR REGULATIONS TESTING OF A SOLAR INSTALLATION

BACKGROUND

Technical Field

The present disclosure relates to testing of solar installations, and more particularly to simplifying test device connection to solar installations.

Description of the Related Art

After a photovoltaic (PV) system is installed, testing may be performed to verify that the system has been installed properly and is safe to operate. For example, International Electrotechnical Commission (IEC) IEC62446-1 regulations define information and documentation required to be handed over to a customer following the installation of a grid connected PV system. Also, IEC62446-1 regulations describe commissioning tests, inspection criteria, and documentation expected to verify safe installation and correct operation of the system.

There are multiple electrical measurements that need to be performed to test systems and issue compliance reports according to IEC62446-1 regulations. Some measurements are performed in dangerous and difficult to reach places, such as steep roofs, for example. Conventionally, a technician needs to reconnect test leads using different terminals of a test device or analyzer, and connect to different parts of an installation to complete all required measurements. These tasks take time and may be performed in hazardous environments.

In the United States, for example, customers often skip safety tests (Category 1 tests per IEC62446-1 regulations), and typically perform only performance measurements (Category 2 tests per IEC62446-1 regulations) to validate system efficiency and solar installation return on investment. The safety tests are often bypassed because they take additional time and may require accessing dangerous exposed places (steep, tall roofs), which are not required by local regulations. If a solar installation is not tested for safety, the solar installation might not be safe to operate. For example, a solar installation that is not safe to operate may cause a fire, which could result in loss of life and property. In Europe the reverse situation happens, Category 1 tests are performed according to mandatory regulations, but Category 2 tests are bypassed because they are optional.

BRIEF SUMMARY

According to the present disclosure, a test device is provided that enables a technician to use a limited number of test leads (e.g., four test leads), which are electrically coupled between respective input terminals of the test device and respective test points of a solar installation, in order to perform complete Category 1 and Category 2 testing according to IEC62446-1 regulations. The test device includes firmware that controls internal switches (e.g., relays), which dynamically electrically couple respective input terminals to respective internal measurement circuits, to automatically perform a full set of tests without requiring reconnection of test leads to the input terminals. Thus, after the test leads are connected to the input terminals of the test device and the respective test points of the solar installation, the test leads remain in the input terminals while multiple tests or measurements are performed.

Accordingly, test devices according to the present disclosure can increase productivity by saving time that would be required to reconnect test leads and perform testing using conventional techniques. In addition, test devices according to the present disclosure can increase safety because technicians can access dangerous places (e.g., roofs) only to connect and disconnect test leads, without requiring those places to be accessed to move and reconnect the test leads during testing. Additionally, test devices according to the present disclosure can enable technicians in the United States and Europe, for example, to perform Category 1 and 2 tests that completely assess a PV system with one set of actions to connect a test device to the PV system.

BRIEF DESCRIPTION OF THE SEVERAL VIEWS OF THE DRAWINGS

Non-limiting and non-exhaustive embodiments are described with reference to the following drawings. In the drawings, like reference numerals refer to like parts throughout the various figures unless otherwise specified.

For a better understanding of the present disclosure, reference will be made to the following Detailed Description, which is to be read in association with the accompanying drawings.

DETAILED DESCRIPTION

A test device for testing an electrical circuit includes input terminals connectable by test leads to different test points of the electrical circuit; at least first and second measurement circuits; switches; a processor; and a storage medium storing instructions that, when executed by the processor, cause the test device to perform a first test of the electrical circuit while one or more of the switches electrically couples at least first and second ones of the input terminals to the first measurement circuit, and perform a second test of the electrical circuit while one or more of the switches electrically couples at least third and fourth ones of the input terminals the second measurement circuit, where the first and second tests are performed without changing connections of the input terminals of the test device to the different test points of the electrical circuit.

Figure 1:
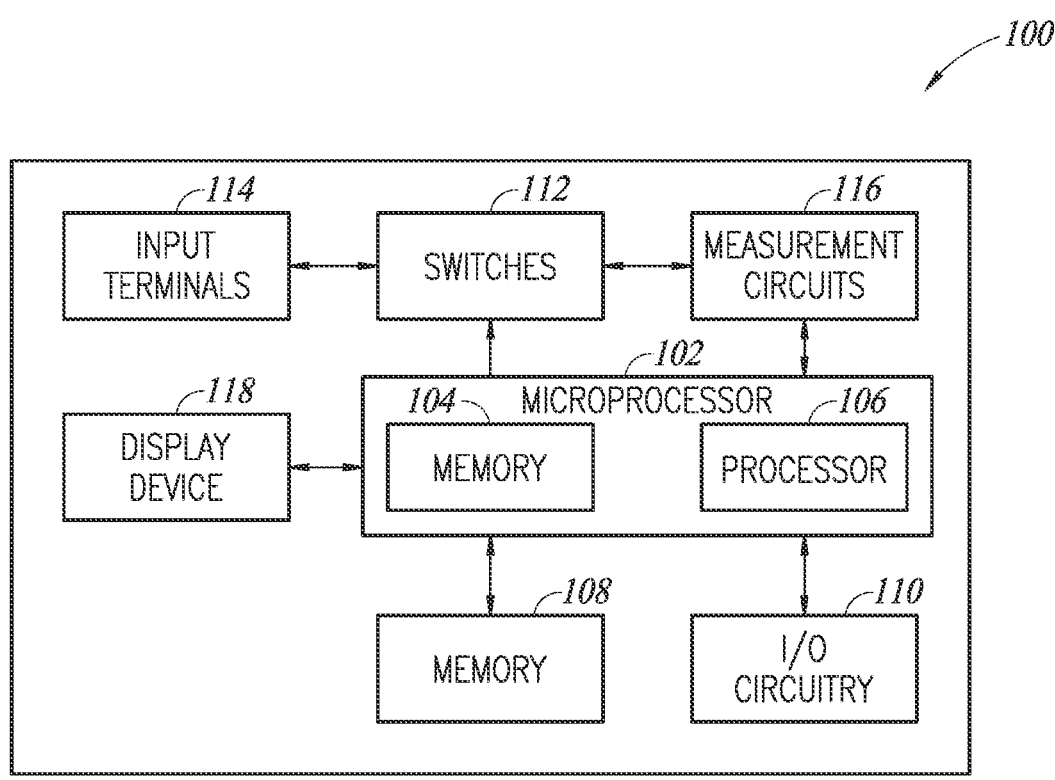
FIG. 1 is a block diagram of a test device, according to one or more embodiments of the present disclosure.

FIG. 1 is a block diagram of a test device 100, according to one or more embodiments of the present disclosure. The test device 100 includes a microprocessor 102 having a memory 104 and a processor 106. The test device 100 also includes a memory 108 that is electrically coupled to the microprocessor 102. The memory 104 can be any type of digital information storage and retrieval devices, such as Random Access Memory (RAM), Read-Only Memory (ROM), Electronically Erasable Programmable Read Only Memory (EEPROM), optical or magnetic media devices. The memory 108 stores instructions that, when executed by the processor 106, cause the test device 100 to perform the functions described herein. In one or more embodiments, the processor 106 uses the memory 104 as a working memory as the processor 106 executes the instructions that are stored by the memory 108. In one or more embodiments, the processor 106 stores test results in the memory 108.

The test device 100 also includes input/output (I/O) circuitry 110, e.g., input devices such as a touch input device, buttons, knobs, and/or dials, that an operator can use to control operation of the test device 100. Additionally, in one or more embodiments, the I/O circuitry 110 includes one or more output devices such as light emitting devices, speakers, a buzzer, and/or data interfaces (e.g., Universal Serial Bus (USB) interfaces), for example.

The test device 100 also includes a plurality of switches 112 that are operationally controlled by the microprocessor 102. In one or more implementations, the microprocessor 102 provides a control signal to each of the switches 112, which causes each of the switches 112 to be in a conductive or closed state when the control signal has a first predetermined state (e.g., voltage level), and cause each of the switches 112 to be in a non-conductive or open state when the control signal has a second predetermined state (e.g., voltage level) that is different from the first predetermined state. In one or more implementations, each of the switches 112 may include an actuator that is configured to manually cause the switch 112 to be in a conductive state or a nonconductive state based on whether the actuator is in a first position or a second position.

Also, the test device 100 includes a plurality of input terminals 114 and a plurality of measurement circuits 116. As will be explained in greater detail with reference to FIG. 2, the microprocessor 102 controls the switches 112 in order to electrically couple each of the input terminals 114 to one of the measurement circuits 116 that is appropriate for a particular test that is to be performed.

In addition, the test device 100 includes a display device 118. The display device 118 graphically displays information to an operator. The microprocessor 102 controls the display device 118 to display information related to testing performed by the test device 100, such as test results and instructions for a user of the test device 100. In one or more embodiments, the display device 118 is a liquid crystal display (LCD) device. In one or more embodiments, the display device 118 includes a touchscreen device.

Figure 2:
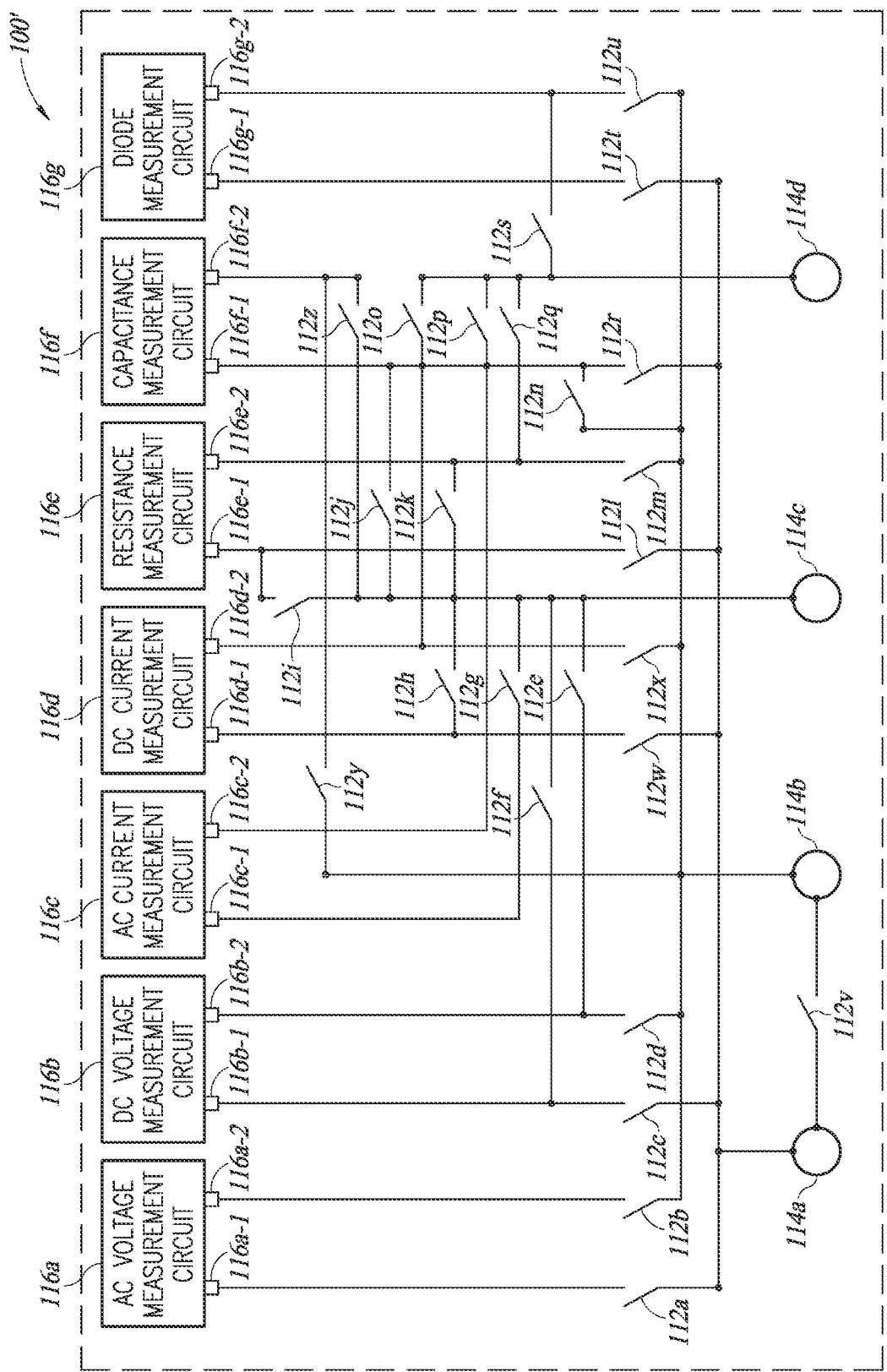
FIG. 2 is a block diagram of a portion of the test device shown in FIG. 1, according to one or more embodiments of the present disclosure.

FIG. 2 is a block diagram of a portion 100' of the test device 100 shown in FIG. 1, according to one or more embodiments of the present disclosure. As shown in FIG. 2, the switches 112 include switches 112a, 112b, 112c, 112d, 112e, 112f, 112g, 112h, 112i, 112j, 112k, 112l, 112m, 112n, 112o, 112p, 112q, 112r, 112s, 112t, 112u, 112v, 112w, 112x, and 112y. The arrangement of switches 112 shown in FIG. 2 is an example; a test device according to the present disclosure can include a different arrangement of switches 112 without departing from the scope of the present disclosure.

Also, the input terminals 114 include input terminals 114a, 114b, 114c, and 114d. Although FIG. 2 shows four input terminals 114, a test device according to the present disclosure can include a different number of input terminals 114 without departing from the scope of the present disclosure.

The measurement circuits 116 includes an Alternating Current (AC) voltage measurement circuit 116a, a Direct Current (DC) voltage measurement circuit 116b, an AC current measurement circuit 116c, a DC current measurement circuit 116d, a resistance measurement circuit 116e, a capacitance measurement circuit 116f, and a diode measurement circuit 116g. The measurement circuits 116 shown in FIG. 2 are examples; a test device according to the present disclosure may include different measurement circuits without departing from the scope of the present disclosure. Also, each of the measurement circuits 116 shown in FIG. 2 may include more than one measurement circuits without departing from the scope of the present disclosure. For example, the resistance measurement circuit 116e may include a first resistance measurement circuit (not shown in FIG. 2) that measures resistance using a relatively high test current, and a second resistance measurement circuit (not shown in FIG. 2) that measures resistance using a relatively high test voltage, wherein the terminals 116e-1 and 116e-2 of the resistance measurement circuit 116e are electrically coupled by switches 112 (not shown in FIG. 2) to one of the first and second resistance measurement circuits of the resistance measurement circuit 116e based on control signals from the microprocessor 102.

More particularly, the switch 112a selectively electrically couples the input terminal 114a to a first terminal 116a-1 of the AC voltage measurement circuit 116a. The switch 112b selectively electrically couples the input terminal 114b to a second terminal 116a-2 of the AC voltage measurement circuit 116a. While the switch 112a and the switch 112b are in a conductive state, the AC voltage measurement circuit 116a measures an AC potential difference between the input terminal 114a and the input terminal 114b, and outputs to the microprocessor 102 a signal or value corresponding to the AC potential difference.

The switch 112c selectively electrically couples the input terminal 114a to a first terminal 116b-1 of the DC voltage measurement circuit 116b. The switch 112d selectively electrically couples the input terminal 114b to a second terminal 116b-2 of the DC voltage measurement circuit 116b. While the switch 112c and the switch 112d are in a conductive state, the DC voltage measurement circuit 116b measures a DC potential difference between the input terminal 114a and the input terminal 114b, and outputs to the microprocessor 102 a signal or value corresponding to the DC potential difference.

The switch 112e selectively electrically couples the input terminal 114c to the second terminal 116b-2 of the DC voltage measurement circuit 116b. The switch 112f selectively electrically couples the input terminal 114c to the first terminal 116b-1 of the DC voltage measurement circuit 116b. While the switch 112e and the switch 112c, for example, are in a conductive state, the DC voltage measurement circuit 116b measures a DC potential difference between the input terminal 114a and the input terminal 114c, and outputs to the microprocessor 102 a signal or value corresponding to the DC potential difference. While the switch 112f and the switch 112d, for example, are in a conductive state, the DC voltage measurement circuit 116b measures a DC potential difference between the input terminal 114b and the input terminal 114d, and outputs to the microprocessor 102 a signal or value corresponding to the DC potential difference.

The switch 112g selectively electrically couples the input terminal 114c to a first terminal 116c-1 of the AC current measurement circuit 116c. The switch 112p selectively electrically couples the input terminal 114d to a second terminal 116c-2 of the AC current measurement circuit 116c. While the switch 112g and the switch 112p are in a conductive state, the AC current measurement circuit 116c measures an AC current that flows between the input terminal 114c and the input terminal 114d, and outputs to the microprocessor 102 a signal or value corresponding to the AC current.

The switch 112h selectively electrically couples the input terminal 114c to a first terminal 116d-1 of the DC current measurement circuit 116d. The switch 112o selectively electrically couples the input terminal 114d to a second terminal 116d-2 of the DC current measurement circuit 116d. While the switch 112h and the switch 112o are in a conductive state, the DC current measurement circuit 116d measures a DC current that flows between the input terminal 114c and the input terminal 114d, and outputs to the microprocessor 102 a signal or value corresponding to the DC current.

The switch 112i selectively electrically couples the input terminal 114c to a first terminal 116e-1 of the resistance measurement circuit 116e. The switch 112q selectively electrically couples the input terminal 114d to a second terminal 116d-2 of the DC current measurement circuit 116d. While the switch 112i and the switch 112q are in a conductive state, the DC current measurement circuit 116d measures a DC current that flows between the input terminal 114c and the input terminal 114d, and outputs to the microprocessor 102 a signal or value corresponding to the DC current.

The switch 112k selectively electrically couples the input terminal 114c to the second terminal 116e-2 of the resistance measurement circuit 116e. The switch 112l selectively electrically couples the input terminal 114a to the first terminal 116e-1 of the resistance measurement circuit 116e. While the switch 112k and the switch 112l are in a conductive state, the resistance measurement circuit 116e measures an electrical resistance between the input terminal 114a and the input terminal 114c, and outputs to the microprocessor 102 a signal or value corresponding to the resistance.

The switch 112m selectively electrically couples the input terminal 114b to the second terminal 116e-2 of the resistance measurement circuit 116e. While the switch 112l and the switch 112m are in a conductive state, the resistance measurement circuit 116e measures a resistance between the input terminal 114a and the input terminal 114b, and outputs to the microprocessor 102 a signal or value corresponding to the resistance.

The switch 112j selectively electrically couples the input terminal 114c to a first terminal 116f-1 of the capacitance measurement circuit 116f. The switch 112y selectively electrically couples the input terminal 114b to a second terminal 116f-2 of the capacitance measurement circuit 116f. While the switch 112j and the switch 112y are in a conductive state, the capacitance measurement circuit 116f measures a capacitance between the input terminal 114b and the input terminal 114c, and outputs to the microprocessor 102 a signal or value corresponding to the capacitance.

The switch 112r selectively electrically couples the input terminal 114a to the first terminal 116f-1 of the capacitance measurement circuit 116f. The switch 112z selectively electrically couples the input terminal 114c to the second terminal 116f-2 of the capacitance measurement circuit 116f. While the switch 112r and the switch 112z are in a conductive state, the capacitance measurement circuit 116f measures a capacitance between the input terminal 114a and the input terminal 114c, and outputs to the microprocessor 102 a signal or value corresponding to the capacitance.

The switch 112t selectively electrically couples the input terminal 114a to a first terminal 116g-1 of the diode measurement circuit 116g. The switch 112s selectively electrically couples the input terminal 114d to a second terminal 116g-2 of the diode measurement circuit 116g. While the switch 112t and the switch 112s are in a conductive state, the diode measurement circuit 116g measures a forward voltage of a diode that is placed between the input terminal 114a and the input terminal 114d, and outputs to the microprocessor 102 a signal or value corresponding to the forward voltage.

The switch 112u selectively electrically couples the input terminal 114b to the second terminal 116g-2 of the diode measurement circuit 116g. While the switch 112t and the switch 112u are in a conductive state, the diode measurement circuit 116g measures a forward voltage of a diode that is placed between the input terminal 114a and the input terminal 114b, and outputs to the microprocessor 102 a signal or value corresponding to the forward voltage.

The switch 112v selectively electrically couples the input terminal 114a to the input terminal 114b. While the switch 112v is in a conductive state, the input terminal 114a to the input terminal 114b are electrically coupled together. While the switch 112v is in a nonconductive state, the input terminal 114a to the input terminal 114b are electrically decoupled from each other.

The switch 112w selectively electrically couples the input terminal 114a to the first terminal 116e-1 of the resistance measurement circuit 116e. The switch 112x selectively electrically couples the input terminal 114b to the second terminal 116e-2 of the resistance measurement circuit 116e. While the switch 112w and the switch 112x are in a conductive state, the resistance measurement circuit 116e measures a resistance between the input terminal 114a and the input terminal 114b, and outputs to the microprocessor 102 a signal or value corresponding to the resistance.

FIGS. 3A, 3B, 3C, 3D, 3E, 3F, 3G, 3H, 3I, 3J, 3K, 3L, 3M, 3N, and 3O are diagrams for explaining test configurations, according to one or more embodiments of the present disclosure. The test configurations shown in FIGS. 3A, 3B, 3C, 3D, 3E, 3F, 3G, 3H, 3I, 3J, 3K, 3L, 3M, 3N, and 3O are examples; a test device according to the present disclosure may be used in other test configurations without departing from the scope of the present disclosure.

Figure 3A:
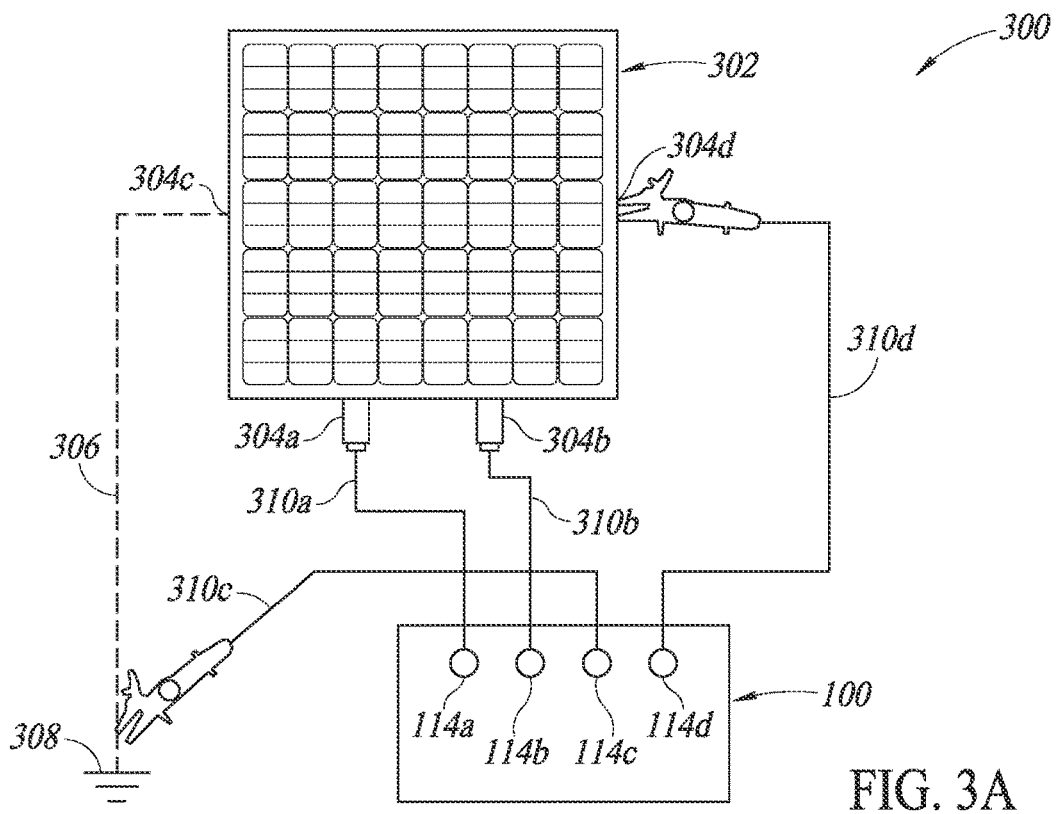
FIGS. 3A, 3B, 3C, 3D, 3E, 3F, 3G, 3H, 3I, 3J, 3K, 3L, 3M, 3N, and 3O are diagrams for explaining test configurations, according to one or more embodiments of the present disclosure.

FIG. 3A shows a portion of a solar installation 300 that includes solar panel 302 having a positive voltage output terminal 304a, a negative voltage output terminal 304b, a ground connector 304c, and a frame 304d. A grounding cable 306 electrically couples the ground connector 304c of the solar panel 302 to a ground or reference potential 308 (e.g., via a busbar or a ground spike that is partially disposed in the ground in the vicinity of the solar installation 300).

The solar installation 300 is electrically coupled to a test device 100. More particularly, a test lead 310a electrically couples the input terminal 114a of the test device 100 to a test point that is the positive voltage output terminal 304a of the solar panel 302, a test lead 310b electrically couples the input terminal 114b of the test device 100 to a test point that is the negative voltage output terminal 304b of the solar panel 300, a test lead 310c electrically couples the input terminal 114c of the test device 100 to a test point that is the ground or reference potential 308, and a test lead 310d electrically couples the input terminal 114*d* of the test device 100 to a test point that is the frame 304*d* of the solar installation 300.

Figure 3B:
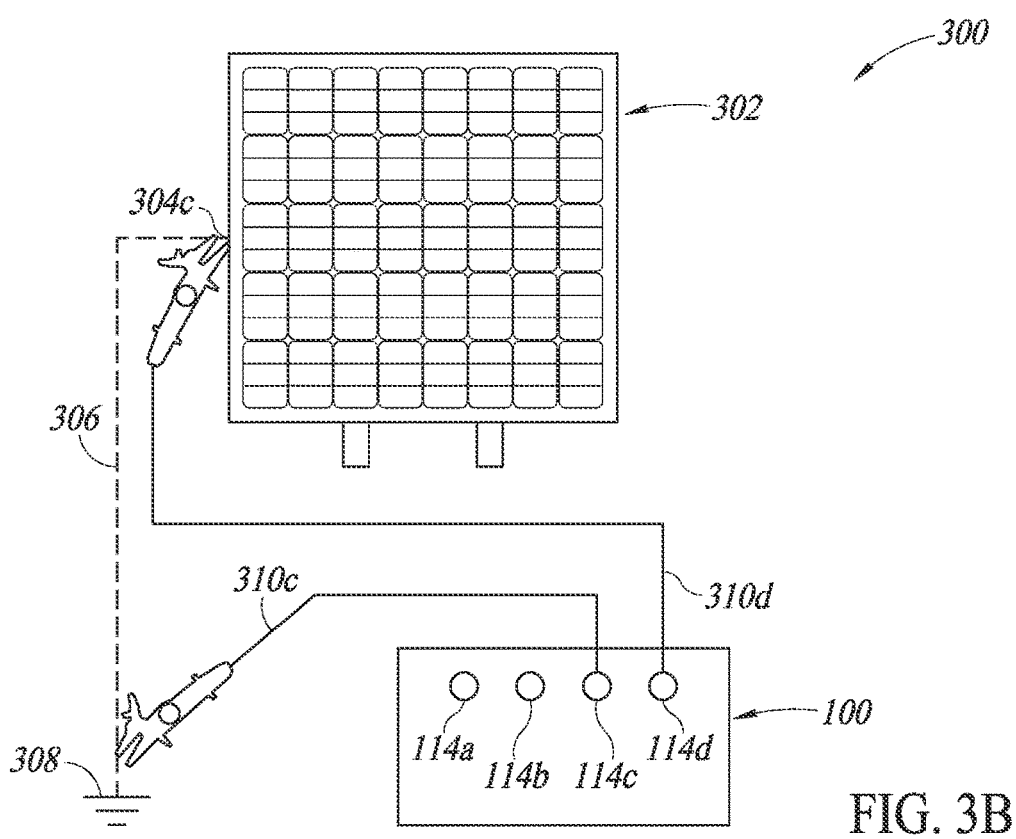

FIG. 3B is similar in many relevant respects to the FIG. 3A, except that the test lead 310*d* electrically couples the input terminal 114*d* of the test device 100 to a test point that is the ground connector 304*c* of the solar installation 300.

Figure 3C:
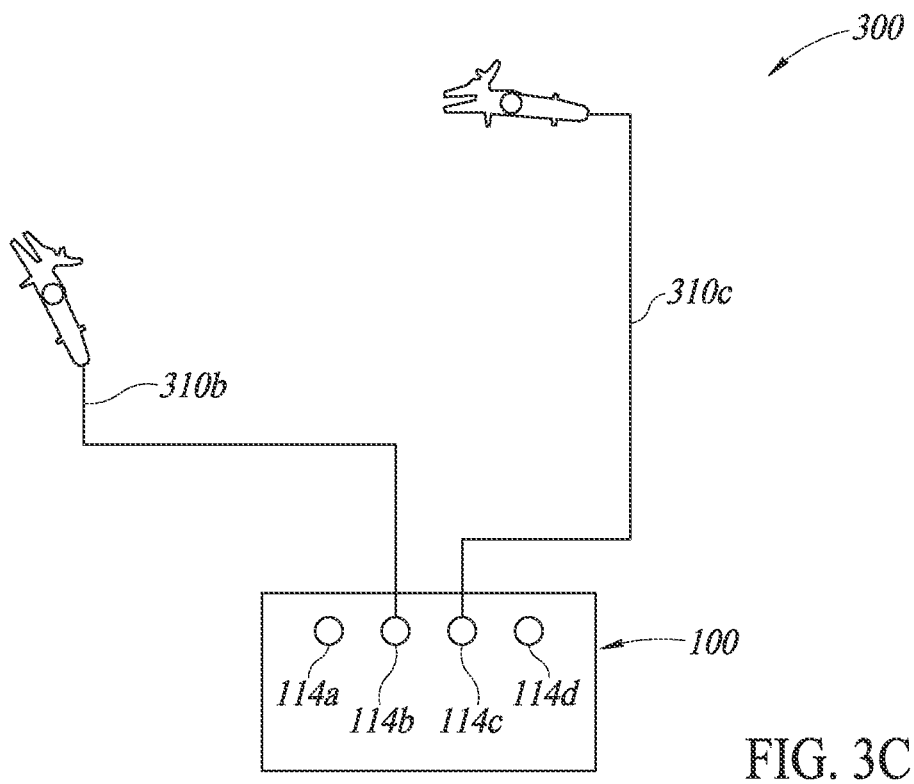

FIG. 3C shows a test configuration in which the test lead 310*b* electrically couples the input terminal 114*b* of the test device 100 to a test point that is a first arbitrary portion of the solar installation 300 (not shown in FIG. 3C), and the test lead 310*c* electrically couples the input terminal 114*c* of the test device 100 to a second arbitrary portion of the solar installation 300 (not shown in FIG. 3C).

Figure 3D:
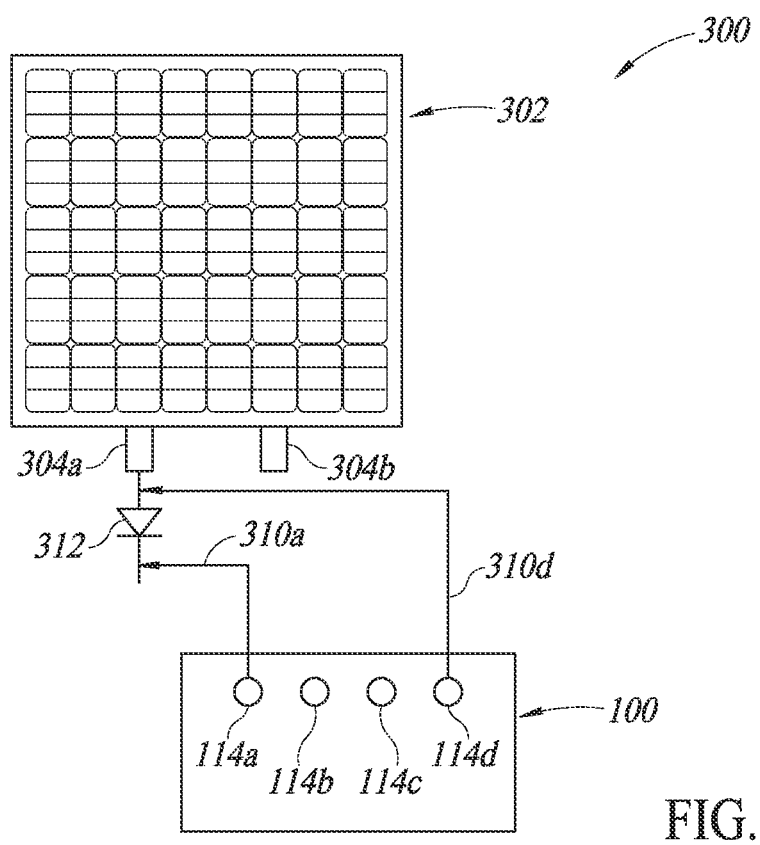

FIG. 3D shows a test configuration in which a blocking diode 312 is electrically coupled between the solar installation 300 and the test device 100. More particularly, an anode of the blocking diode 312 is electrically coupled to the positive voltage output terminal 304*a* of the solar panel 302, and a cathode of the blocking diode 312 is electrically coupled to the test lead 310*a*. The test lead 310*a* electrically couples the input terminal 114*a* of the test device 100 to a test point that is the cathode of the blocking diode 312, and the test lead 310*d* electrically couples the input terminal 114*d* of the test device 100 a test point that is the anode of the blocking diode 312.

Figure 3E:
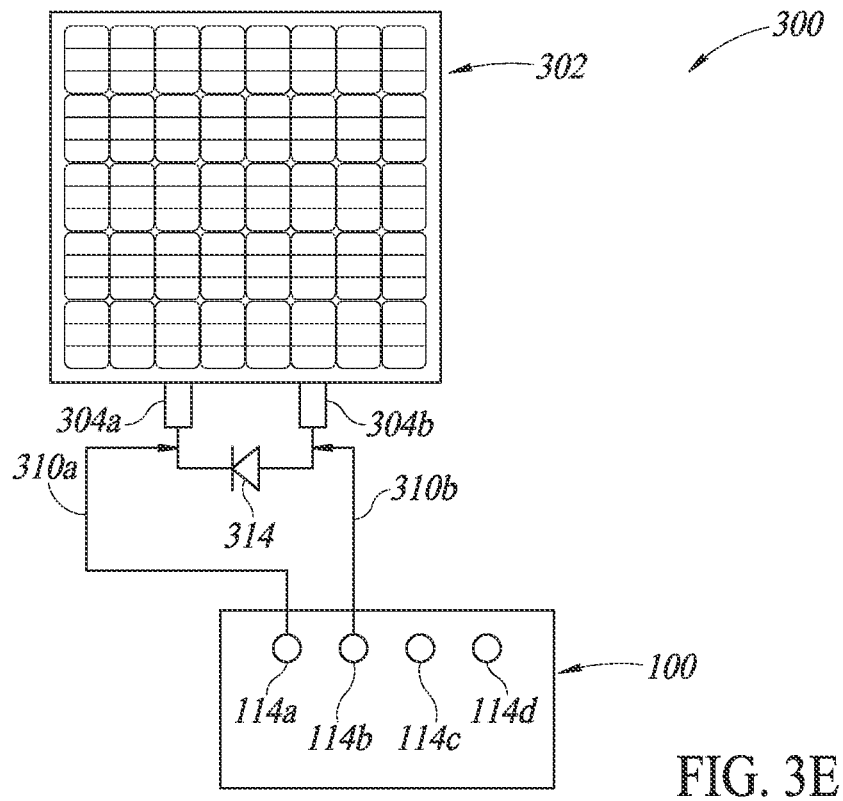

FIG. 3E shows a test configuration in which a cathode of a bypass diode 314 is electrically coupled to the positive voltage output terminal 304*a* of the solar panel 302, and an anode of the bypass diode 314 is electrically coupled to the negative voltage output terminal 304*b* of the solar panel 300. The test lead 310*a* electrically couples the input terminal 114*a* of the test device 100 to a test point that is the cathode of the bypass diode 314, and the test lead 310*b* electrically couples the input terminal 114*b* of the test device 100 to a test point that is the anode of the bypass diode 314.

Figure 3F:
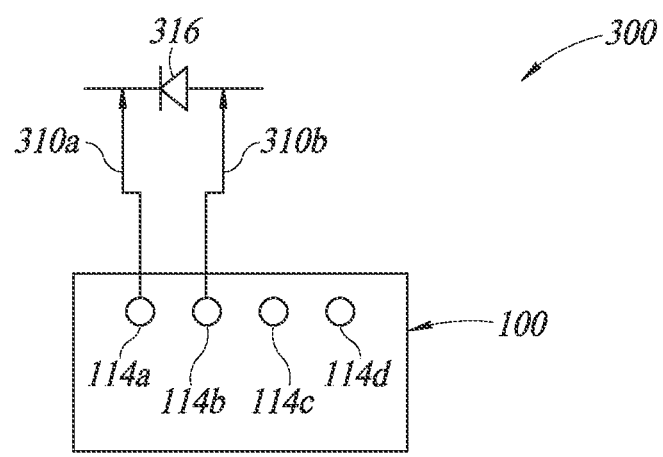

FIG. 3F shows a test configuration in which a cathode of a diode 316 has been removed from the solar installation 300. The test lead 310*a* electrically couples a cathode of the diode 316 to the input terminal 114*a* of the test device 100, and the test lead 310*b* electrically couples an anode of the diode 316 to the input terminal 114*b* of the test device 100.

Figure 3G:
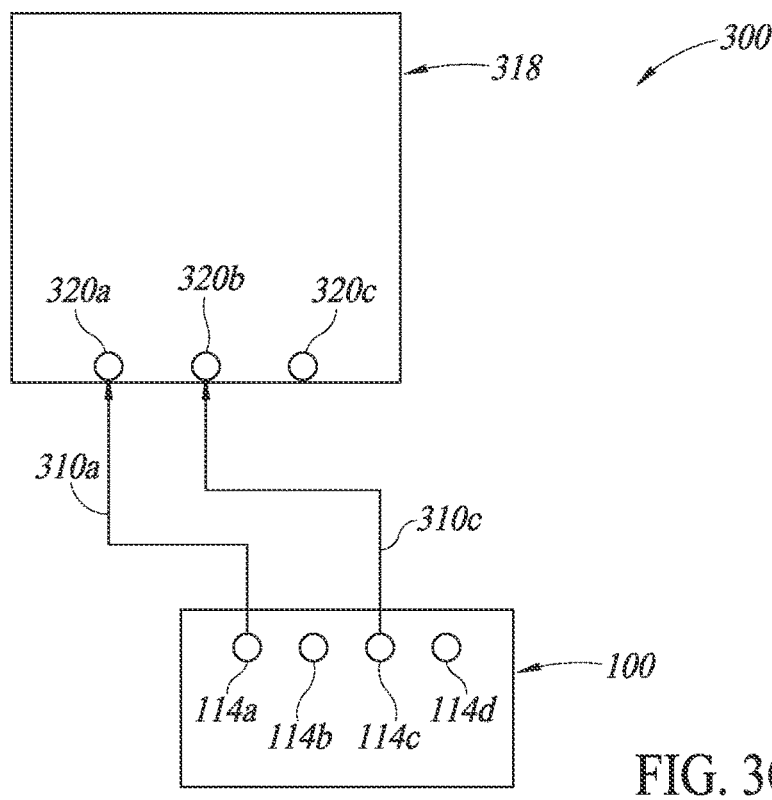

FIG. 3G shows a test configuration in which the test device 100 is electrically coupled to an overvoltage protection device array 318. For example, the overvoltage protection device array 318 is a Multipole Surge Arrester—Type 2 from DEHN Inc. More particularly, the test lead 310*a* electrically couples the input terminal 114*a* of the test device 100 to a test point that is a first terminal 320*a* of the overvoltage protection device array 318, and the test lead 310*c* electrically couples the input terminal 114*c* of the test device 100 to a test point that is a second terminal 320*b* of the overvoltage protection device array 318.

Figure 3H:
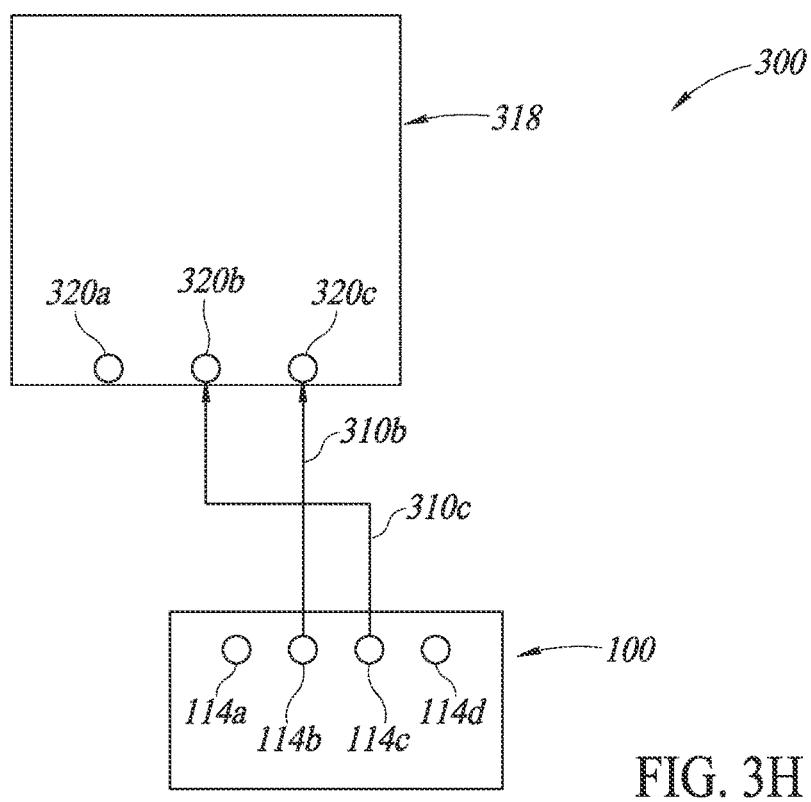

FIG. 3H shows another test configuration in which the test device 100 is electrically coupled to the overvoltage protection device array 318. More particularly, the test lead 310*c* electrically couples the input terminal 114*c* of the test device 100 to a test point that is the second terminal 320*b* of the overvoltage protection device array 318, and the test lead 310*b* electrically couples the input terminal 114*b* of the test device 100 to a test point that is a third terminal 320*c* of the overvoltage protection device array 318.

Figure 3I:
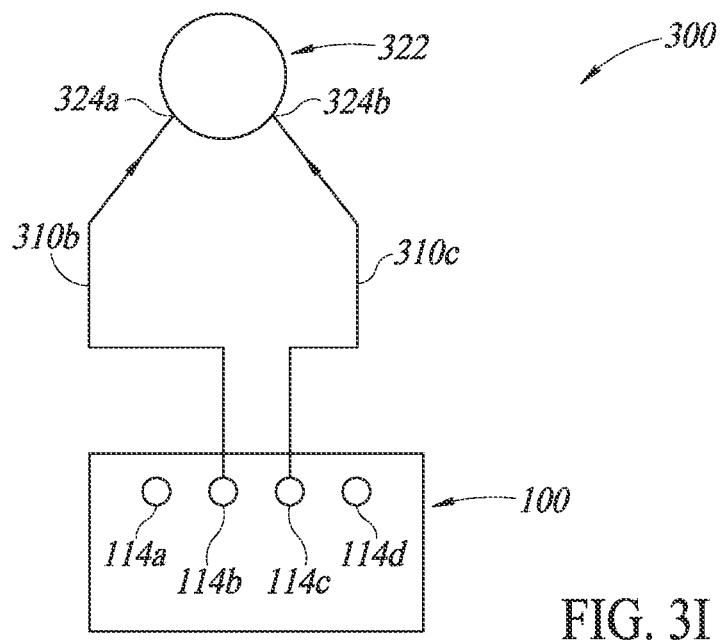

FIG. 3I shows a test configuration in which the test device 100 is electrically coupled to an overvoltage protection device 322. For example, the overvoltage protection device 322 is a varistor or voltage-dependent resistor. More particularly, the test lead 310*b* electrically couples the input terminal 114*b* of the test device 100 to a test point that is a first terminal 324*a* of the overvoltage protection device 322 to, and the test lead 310*c* electrically couples the input terminal 114*c* of the test device 100 to a test point that is a second terminal 324*b* of the overvoltage protection device 322.

Figure 3J:
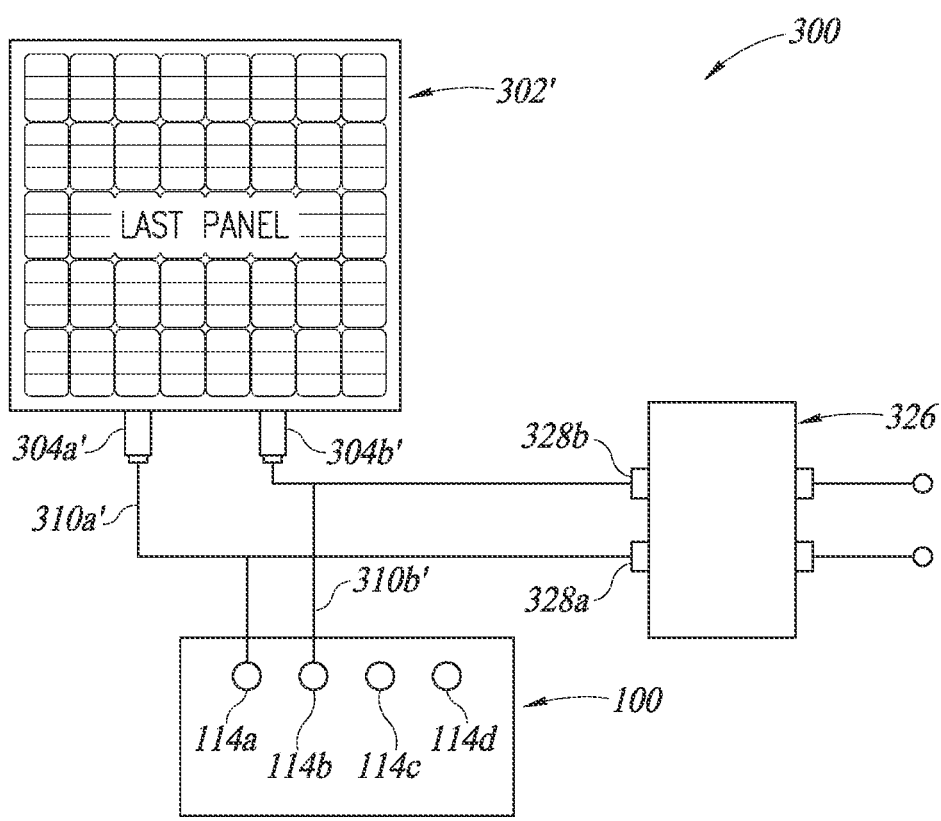

FIG. 3J shows a test configuration in which the test device 100 is electrically coupled between a last solar panel 302' of the solar installation 300 and an inverter 326. For example, the solar installation 300 is formed by electrically coupling the solar panel 302, the solar panel 302', and the inverter 326 in parallel. The test configuration shown in FIG. 3J uses two test leads 310*a*' and 310*b*', each of which includes a Y-connector at one end. More particularly, a first connector of the Y-connector of the test lead 310*a*' is electrically coupled to a test point that is a positive voltage output terminal 304*a*' of the solar panel 302', a second connector of the Y-connector of the test lead 310*a*' is electrically coupled to the input terminal 114*a* of the test device 100, and a connector at the other end of the test lead 310*a*' is electrically coupled to a test point that is a positive DC voltage input terminal 328*a* of the inverter 326. Also, a first connector of the Y-connector of the test lead 310*b*' is electrically coupled to a test point that is a negative voltage output terminal 304*b*' of the solar panel 302', a second connector of the Y-connector of the test lead 310*b*' is electrically coupled to the input terminal 114*b* of the test device 100, and a connector at the other end of the test lead 310*b*' is electrically coupled to a test point that is a negative DC voltage input terminal 328*b* of the inverter 326.

Figure 3K:
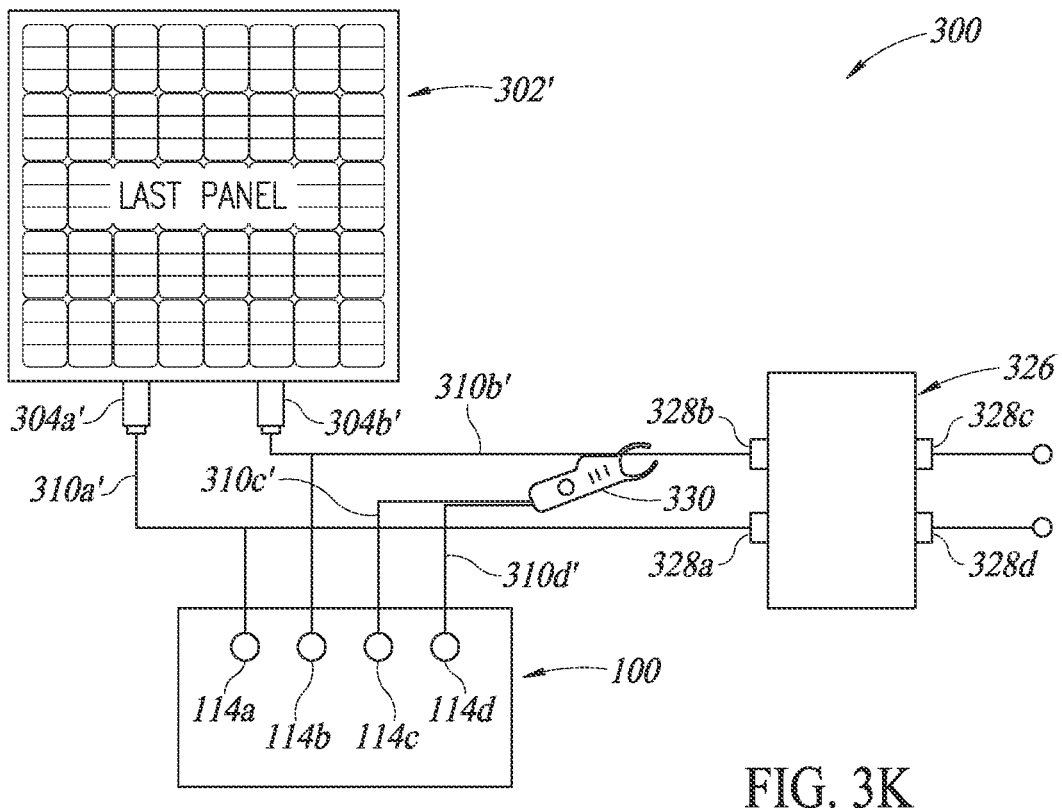

FIG. 3K shows another test configuration in which the test device 100 is electrically coupled between the last solar panel 302' of the solar installation 300 and the inverter 326. The first connector of the Y-connector of the test lead 310*a*' is electrically coupled to a test point that is the positive voltage output terminal 304*a*' of the solar panel 302', the second connector of the Y-connector of the test lead 310*a*' is electrically coupled to the input terminal 114*a* of the test device 100, and a connector at the other end of the test lead 310*a*' is electrically coupled to a test point that is a positive DC voltage input terminal 328*a* of the inverter 326. Also, the first connector of the Y-connector of the test lead 310*b*' is electrically coupled to the negative voltage output terminal 304*b*' of the solar panel 302', the second connector of the Y-connector of the test lead 310*b*' is electrically coupled to the input terminal 114*b* of the test device 100, and a connector at the other end of the test lead 310*b*' is electrically coupled to a negative DC voltage input terminal 328*b* of the inverter 326. In addition, the test leads 310*c*' and 310*d*' are electrically coupled to respective terminals of a clamp 330, which is placed around the test lead 310*b*'. Additionally or alternatively, the clamp 330 can be placed around the test lead 310*a*', and the current flowing in the test lead 310*a*' can be measured. The current measurement by clamp 330 is only an example; current can also be measured in a direct method via a shunt resistance, for example.

Figure 3L:
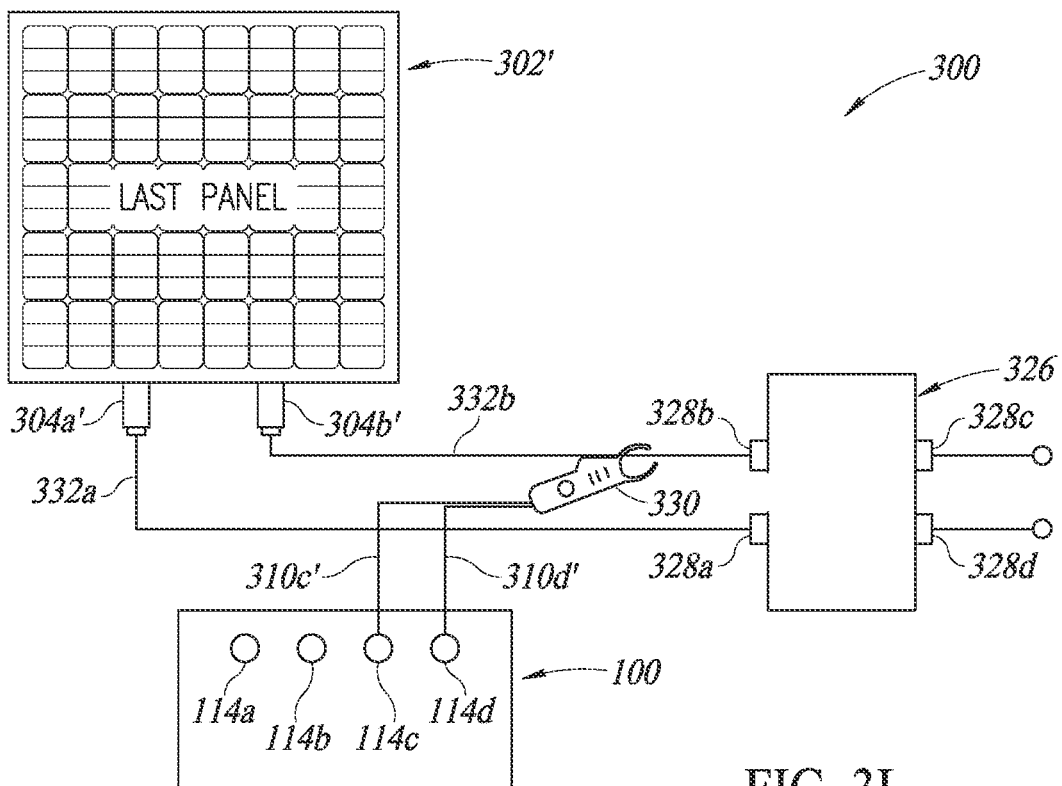

FIG. 3L shows yet another test configuration in which the test device 100 is electrically coupled between the last solar panel 302' of the solar panel assembly and the inverter 326. The test configuration shown in FIG. 3L uses two test leads 310*c*' and 310*d*'. The test lead 310*c*' electrically couples the input terminal 114*c* of the test device 100 to a first terminal of the clamp 330, and the test lead 310*d*' electrically couples the input terminal 114*d* of the test device 100 to a second terminal of the clamp 330. For example, the clamp 330 is similar in many relevant respects to a Fluke i400 AC Current Clamp. More particularly, a cable 332*a* electrically couples the positive voltage output terminal 304*a*' of the solar panel 302' to the positive DC voltage input terminal 328*a* of the inverter 326, and a cable 332*b* electrically couples the negative voltage output terminal 304*b*' of the solar panel 302' to the negative DC voltage input terminal 328*b* of the inverter 326. Also, the clamp 330 is placed around the cable 332*b*. Additionally or alternatively, the clamp 330 can be placed around the cable 332*a*, and the current in the cable 332*a* can be measured. The current measurement by clamp 330 is only an example; current can also be measured in a direct method via a shunt resistance, for example.

Figure 3M:
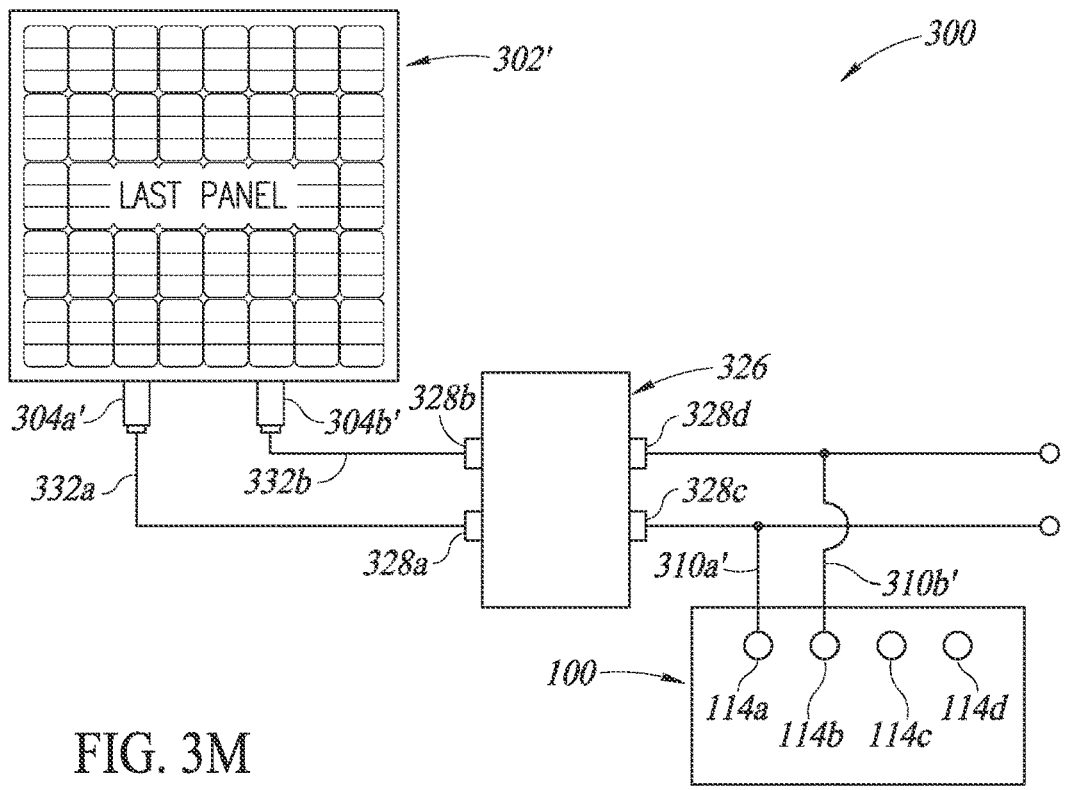

FIG. 3M shows a test configuration in which the test device 100 is electrically coupled to the output of the inverter 326. A cable 334 electrically couples a first AC voltage output terminal 328*c* of the inverter 326 to a load (not shown), for example, mains grid. Also, a cable 336 electrically couples a second AC voltage output terminal 328*d* of the inverter 326 to the load (e.g., mains grid). Test leads 310*a*' and 310*b*' electrically couple the input terminals 114*a* and 114*b* in parallel with the output terminals 328*c* and 328*d* of the inverter 326, respectively.

Figure 3N:
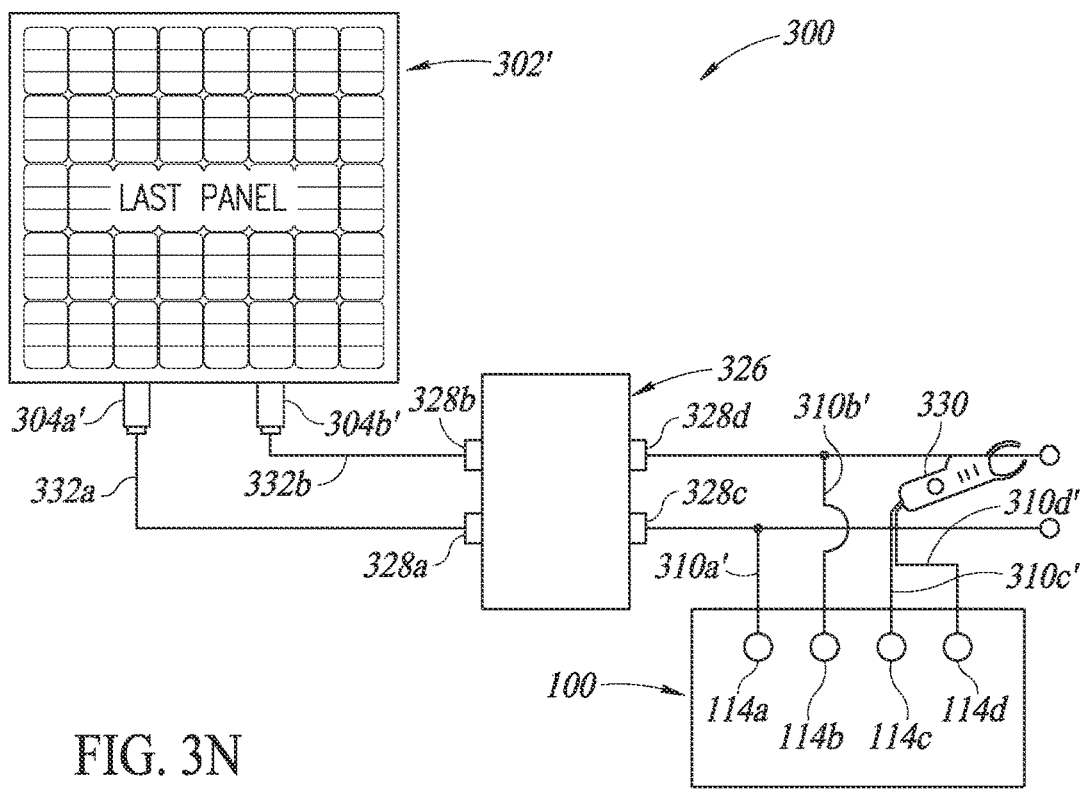

FIG. 3N shows another test configuration in which the test device 100 is electrically coupled to the output of the inverter 326. The test configuration shown in FIG. 3N is similar in many relevant respects to the test configuration shown in FIG. 3M, except that a test lead 310*c*' electrically couples the input terminal 114*c* of the test device 100 to the first terminal of the clamp 330, and a test lead 310*d*' electrically couples the input terminal 114*d* of the test device 100 to the second terminal of the clamp 330, which is placed around the cable 334. Additionally or alternatively, the clamp 330 can be placed around the cable 336, and the current flowing in the cable 336 can be measured. The current measurement by clamp 330 is only an example; current can also be measured in a direct method via a shunt resistance, for example.

Figure 3O:
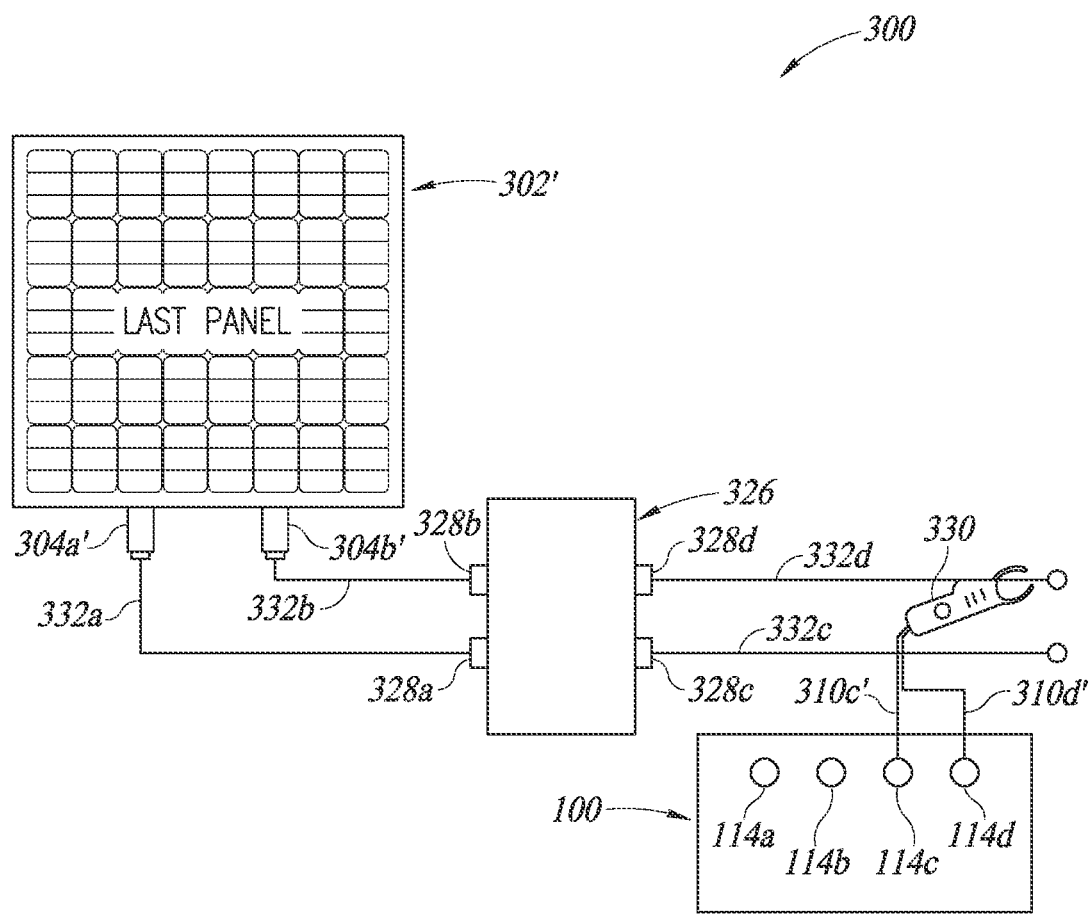

FIG. 3O shows yet another test configuration in which the test device 100 is electrically coupled to the output of the inverter 326. The test configuration shown in FIG. 3O is similar in many relevant respects to the test configuration shown in FIG. 3N, except that in FIG. 3O the test leads 310*a*' and 310*b*' are not used to electrically couple the input terminals 114*a* and 114*b* in parallel with the output terminals 328*c* and 328*d* of the inverter 326, respectively.

Figure 4:
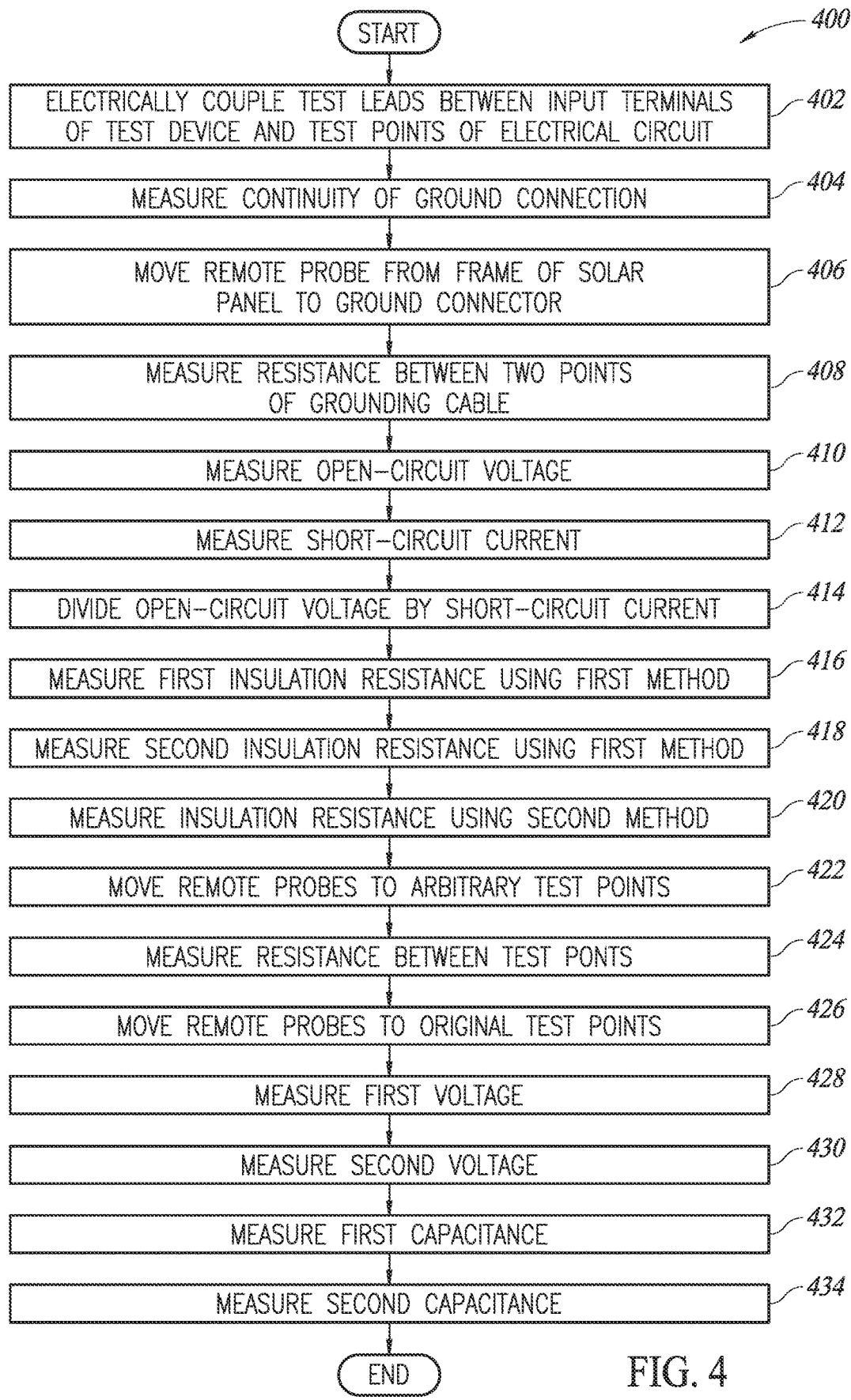
FIG. 4 shows a flowchart for a method of testing an electrical circuit, according to one or more embodiments of the present disclosure.

FIG. 4 shows a flowchart for a method 400 of testing an electrical circuit, according to one or more embodiments of the present disclosure. The method 400 begins at 402.

At 402, a technician electrically couples a plurality of test leads between a respective plurality of input terminals of a test device and a respective plurality of test points of the electrical circuit. For example, at 402, as shown in FIG. 3A, the technician electrically couples the test lead 310*a* between the input terminal 114*a* of the test device 100 and a test point that is the positive voltage output terminal 304*a* of the solar panel 302, electrically couples the test lead 310*b* between the input terminal 114*b* of the test device 100 and a test point that is the negative voltage output terminal 304*b* of the solar panel 300, electrically couples the test lead 310*c* between the input terminal 114*c* of the test device 100 and a test point that is the ground or reference potential 308, and electrically couples the test lead 310*d* between the input terminal 114*d* of the test device 100 and a test point that is the frame 304*d* of the solar installation 300. The method 400 then proceeds to 404.

At 404, the test device measures continuity of a ground connection. For example, at 404, the switches 112*i* and 112*p* electrically couple the resistance measurement circuit 116*e* to the input terminals 114*c* and 114*d*. The resistance measurement circuit 116*e* then measures a resistance between the input terminals 114*c* and 114*d*, and outputs to the microprocessor 102 a signal or value corresponding to the result. In one or more implementations, the microprocessor 102 provides control signals that cause switches 112 other than the switches 112*i* and 112*p* to be in a nonconductive state. In one or more implementations, the microprocessor 102 causes the display device 118 to display a result of performing the measurement or test. The method 400 then proceeds to 406.

In one or more implementations, the microprocessor 102 automatically selectively couples the resistance measurement circuit 116*e* to the input terminals 114*c* and 114*d* at 404 by providing control signals to the switches 112 based on a program or other processor-executable instructions that cause the microprocessor 102 to perform a predetermined sequence of tests or measurements, wherein the program or processor-executable instructions specify, for each test or measurement, at least one of the measurement circuits 116 to which two or more of the input terminals 114 are to be electrically coupled and/or one or more of the switches 112 that are be in a conductive state and/or one or more of the switches 112 that are be in a nonconductive state. In one or more implementations, the microprocessor 102 selectively couples the resistance measurement circuit 116*e* to the input terminals 114*c* and 114*d* in response to one or more user inputs, for example, a user selecting an icon displayed by the display device 118 that lists the name of a particular test or measurement (e.g., Ground Connection Continuity Measurement). In one or more implementations, the resistance measurement circuit 116*e* is electrically coupled to the input terminals 114*c* and 114*d* in response to a user input corresponding to the user rotating a dial of the I/O circuitry 110 to a position that corresponds to a particular test or measurement, which manually causes the switches 112*i* and 112*p* to be in a conductive state, and causes switches 112 other than the switches 112*i* and 112*p* to be in a nonconductive state.

At 406, the technician moves a remote probe from a frame of a solar panel to a ground connector. For example, at 406, as shown in FIG. 3B, the technician moves a remote probe coupled to the test lead 310*d* to the ground connector 304*c* of the solar installation 300. In one or more implementations, the microprocessor 102 causes the display device 118 to display a message with an instruction to connect the test lead 310*d* to the input terminal 114*d* and to the ground connector 304*c* of the solar installation 300. The method 400 then proceeds to 408.

At 408, the test device measures measure a resistance between two points of a grounding cable. For example, at 408, the switches 112*i* and 112*p* electrically couple the resistance measurement circuit 116*e* to the input terminals 114*c* and 114*d*, either automatically or in response to one or more user inputs as discussed above. The resistance measurement circuit 116*e* then measures a resistance between the input terminals 114*c* and 114*d* in order to measure a resistance between two points of the grounding cable 306, and outputs to the microprocessor 102 a signal or value corresponding to the result. In one or more implementations, the microprocessor 102 provides control signals that cause switches 112 other than the switches 112*i* and 112*p* to be in a nonconductive state. In one or more implementations, the microprocessor 102 causes the display device 118 to display a result of performing the measurement or test. The method 400 then proceeds to 410.

At 410, the test device measures an open-circuit voltage. For example, at 410, the switches 112c and 112d electrically couple the DC voltage measurement circuit 116b to the input terminals 114a and 114b, either automatically or in response to one or more user inputs as discussed above. The DC voltage measurement circuit 116b then measures a voltage between the input terminals 114a and 114b, and outputs to the microprocessor 102 a signal or value corresponding to the result. In one or more implementations, the microprocessor 102 provides control signals that cause switches 112 other than the switches 112c and 112d to be in a nonconductive state. In one or more implementations, the microprocessor 102 causes the display device 118 to display a result of performing the measurement or test. The method 400 then proceeds to 412.

At 412, the test device measures a short-circuit current. For example, at 412, the switches 112w and 112x electrically couple the DC current measurement circuit 116d to the input terminals 114a and 114b, either automatically or in response to one or more user inputs as discussed above. The DC current measurement circuit 116d then measures a current flowing between the input terminals 114a and 114b, and outputs to the microprocessor 102 a signal or value corresponding to the result. In one or more implementations, the microprocessor 102 provides control signals that cause switches 112 other than the switches 112w and 112x to be in a nonconductive state. In one or more implementations, the microprocessor 102 causes the display device 118 to display a result of performing the measurement or test. The method 400 then proceeds to 414.

At 414, the test device divides the open-circuit voltage measured at 410 by the short-circuit current measured at 412. For example, at 414, microprocessor 102 of the test device 100 performs curve tracing by dividing the open-circuit voltage measured at 410 by the short-circuit current measured at 412 and causes the resulting value to be displayed by the display device 118. The method 400 then proceeds to 416.

At 416, the test device measures a first insulation resistance using a first method. For example, at 416, the switches 112i and 112m electrically couple the resistance measurement circuit 116e to the input terminals 114b and 114c, either automatically or in response to one or more user inputs as discussed above. The resistance measurement circuit 116e then measures a resistance between the input terminals 114b and 114c, and outputs to the microprocessor 102 a signal or value corresponding to the result. In one or more implementations, the microprocessor 102 provides control signals that cause switches 112 other than the switches 112i and 112m to be in a nonconductive state. In one or more implementations, the microprocessor 102 causes the display device 118 to display a result of performing the measurement or test. The method 400 then proceeds to 418.

At 418, the test device measures a second insulation resistance using the first method. For example, at 418, the switches 112l and 112k electrically couple the resistance measurement circuit 116e to the input terminals 114a and 114c, either automatically or in response to one or more user inputs as discussed above. The resistance measurement circuit 116e then measures a resistance between the input terminals 114a and 114c, and outputs to the microprocessor 102 a signal or value corresponding to the result. In one or more implementations, the microprocessor 102 provides control signals that cause switches 112 other than the switches 112l and 112k to be in a nonconductive state. In one or more implementations, the microprocessor 102 causes the display device 118 to display a result of performing the measurement or test. The method 400 then proceeds to 420.

At 420, the test device measures an insulation resistance using a second method. For example, at 420, the switches 112v, 112m, and 112i electrically couple the resistance measurement circuit 116e to the input terminals 114a, 114b, and 114c, either automatically or in response to one or more user inputs as discussed above. The resistance measurement circuit 116e then measures a resistance between the input terminals 114a and 114b, which are short-circuited by the switch 112v, and the input terminal 114c, and outputs to the microprocessor 102 a signal or value corresponding to the result. In one or more implementations, the microprocessor 102 provides control signals that cause switches 112 other than the switches 112v, 112m, and 112i to be in a nonconductive state. In one or more implementations, the microprocessor 102 causes the display device 118 to display a result of performing the measurement or test. The method 400 then proceeds to 422.

At 422, the technician moves remote probes to arbitrary test points on the solar panel. For example, at 422, as shown in FIG. 3C, the technician moves remote probe coupled to the test leads 310b and 310c, respectively, to two arbitrary test points on the solar installation 300 (not shown in FIG. 3C). The method 400 then proceeds to 424.

At 424, the test device measures a resistance between the two test points. For example, at 424, the switches 112i and 112m electrically couple the resistance measurement circuit 116e to the input terminals 114b and 114c, either automatically or in response to one or more user inputs as discussed above. The resistance measurement circuit 116e then measures a resistance between the input terminals 114b and 114c, and outputs to the microprocessor 102 a signal or value corresponding to the result. In one or more implementations, the microprocessor 102 provides control signals that cause switches 112 other than the switches 112i and 112m to be in a nonconductive state. In one or more implementations, the microprocessor 102 causes the display device 118 to display a result of performing the measurement or test. The method 400 then proceeds to 426.

At 426, the technician moves remote probes back to the original test points. For example, at 426, as shown in FIG. 3A, the technician moves the remote probe coupled to the test lead 310b back to the positive voltage output terminal 304a, and moves the remote probe coupled to the test lead 310c back to the ground or reference potential 308. The method 400 then proceeds to 428.

At 428, the test device measures a voltage between the positive voltage output terminal of the solar and a ground or reference potential. For example, at 428, the switches 112c and 112e electrically couple the DC voltage measurement circuit 116b to the input terminals 114a and 114c, either automatically or in response to one or more user inputs as discussed above. In one or more implementations, the microprocessor 102 provides control signals that cause switches 112 other than the switches 112c and 112e to be in a nonconductive state. In one or more implementations, the microprocessor 102 causes the display device 118 to display a result of performing the measurement or test. The method 400 then proceeds to 430.

At 430, the test device measures a voltage between the negative voltage output terminal of the solar panel and a ground or reference potential. For example, at 430, the switches 112d and 112f electrically couple the DC voltage measurement circuit 116b to the input terminals 114b and 114c, either automatically or in response to one or more user inputs as discussed above. In one or more implementations, the microprocessor 102 provides control signals that cause switches 112 other than the switches 112*d* and 112*f* to be in a nonconductive state. In one or more implementations, the microprocessor 102 causes the display device 118 to display a result of performing the measurement or test. The method 400 then proceeds to 432.

At 432, the test device measures a capacitance between the positive voltage output terminal and the negative voltage output terminal of the solar panel. For example, at 432, the switches 112*r* and 112*y* electrically couple the capacitance measurement circuit 116*f* to the input terminals 114*a* and 114*b*, either automatically or in response to one or more user inputs as discussed above. In one or more implementations, the microprocessor 102 provides control signals that cause switches 112 other than the switches 112*r* and 112*y* to be in a nonconductive state. In one or more implementations, the microprocessor 102 causes the display device 118 to display a result of performing the measurement or test. The method 400 then proceeds to 434.

At 434, the test device measures a capacitance between the negative voltage output terminal of the solar and a ground or reference potential. For example, at 434, the switches 112*j* and 112*y* electrically couple the capacitance measurement circuit 116*f* to the input terminals 114*b* and 114*c*, either automatically or in response to one or more user inputs as discussed above. In one or more implementations, the microprocessor 102 provides control signals that cause switches 112 other than the switches 112*j* and 112*y* to be in a nonconductive state. In one or more implementations, the microprocessor 102 causes the display device 118 to display a result of performing the measurement or test. The method 400 then ends.

Figure 5:
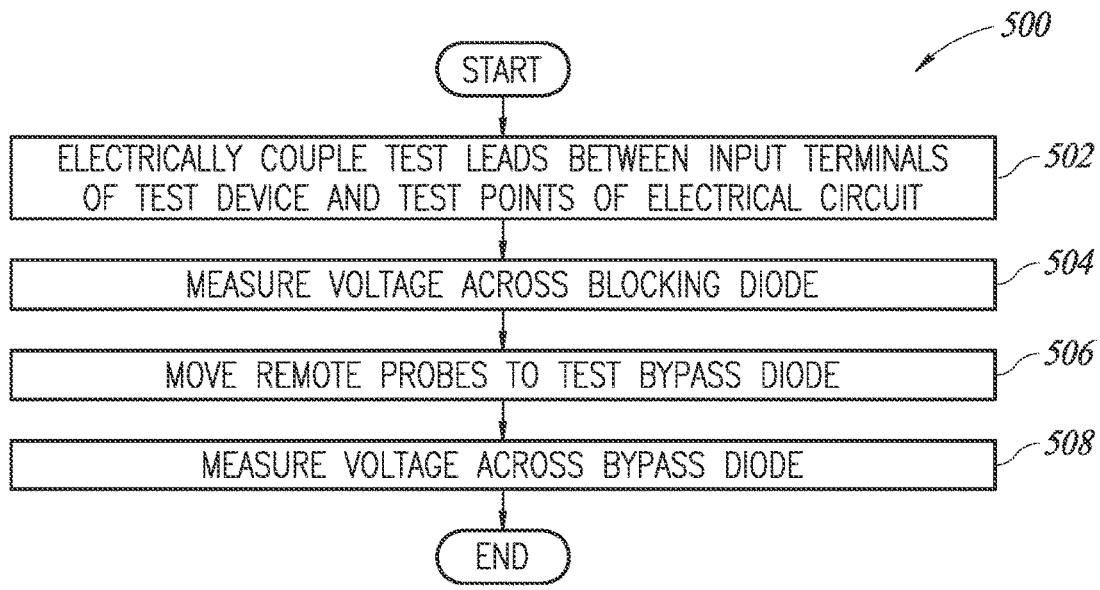
FIG. 5 shows a flowchart for a method of testing an electrical circuit, according to one or more embodiments of the present disclosure.

FIG. 5 shows a flowchart for a method 500 of testing an electrical circuit, according to one or more embodiments of the present disclosure. The method 500 begins at 502.

At 502, a technician electrically couples a plurality of test leads between a respective plurality of input terminals of a test device and a respective plurality of test points of the electrical circuit. For example, at 502, as shown in FIG. 3D, the technician electrically couples the anode of the blocking diode 312 to the positive voltage output terminal 304*a* of the solar panel 302, electrically couples the test lead 310*a* to the cathode of the blocking diode 312, and electrically coupled the test lead 310*d* to the anode of the blocking diode 312. The method 500 then proceeds to 504.

At 504, the test device measures a voltage across a blocking diode. For example, at 504, the switches 112*s* and 112*t* electrically couple the diode measurement circuit 116*g* to the input terminals 114*a* and 114*d*, either automatically or in response to one or more user inputs as discussed above. The diode measurement circuit 116*g* then measures a voltage across the input terminals 114*a* and 114*d*, and outputs to the microprocessor 102 a signal or value corresponding to the result. In one or more implementations, the microprocessor 102 provides control signals that cause switches 112 other than the switches 112*s* and 112*t* to be in a nonconductive state. In one or more implementations, the microprocessor 102 causes the display device 118 to display a result of performing the measurement or test. The method 500 then proceeds to 506.

At 506, the technician moves remote probes to test a bypass diode. For example, at 506, as shown in FIG. 3E, the technician electrically couples the cathode of the bypass diode 314 to the positive voltage output terminal 304*a* of the solar panel 302, electrically couples the anode of the bypass diode 314 to the negative voltage output terminal 304*b* of the solar panel 300, electrically couples the test lead 310*a* to the cathode of the bypass diode 314, and electrically couples the test lead 310*b* to the anode of the bypass diode 314. The method 500 then proceeds to 508.

At 508, the test device measures a voltage across the bypass diode. For example, at 508, the switches 112*t* and 112*u* electrically couple the diode measurement circuit 116*g* to the input terminals 114*a* and 114*b*, either automatically or in response to one or more user inputs as discussed above. The diode measurement circuit 116*g* then measures a voltage across the input terminals 114*a* and 114*b*, and outputs to the microprocessor 102 a signal or value corresponding to the result. In one or more implementations, the microprocessor 102 provides control signals that cause switches 112 other than the switches 112*t* and 112*u* to be in a nonconductive state. In one or more implementations, the microprocessor 102 causes the display device 118 to display a result of performing the measurement or test. The method 500 then ends.

Figure 6:
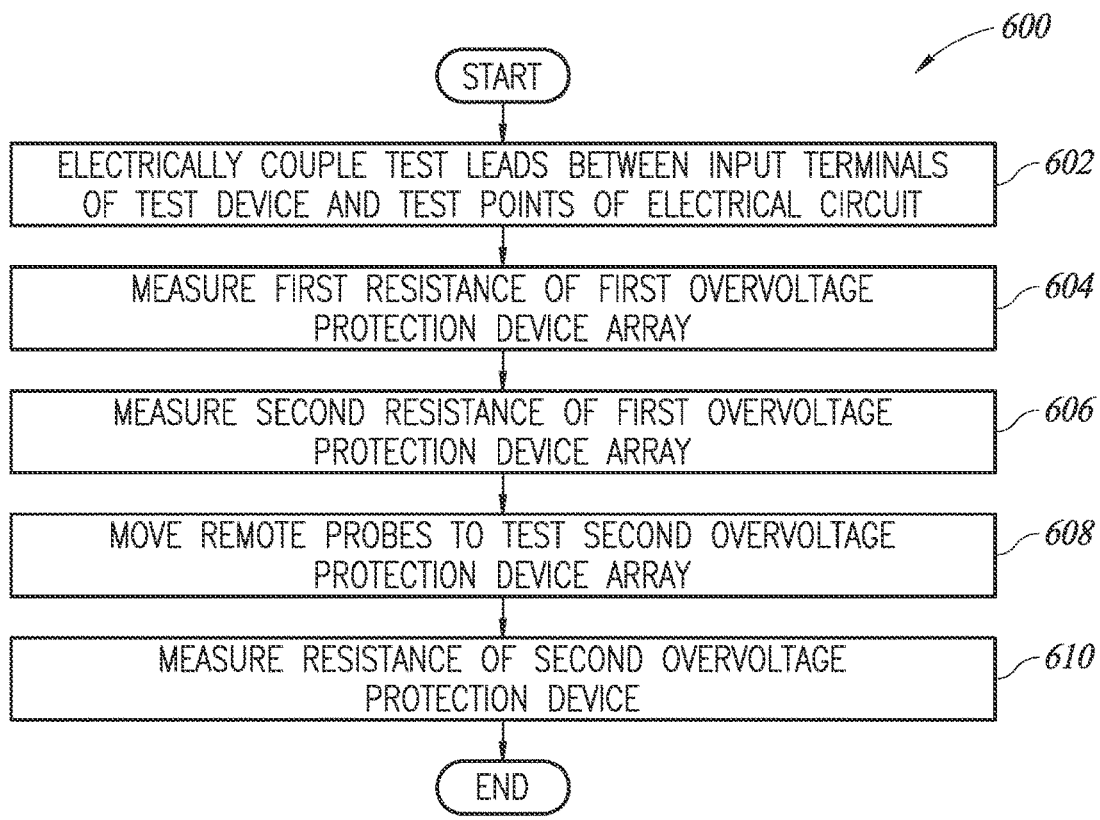
FIG. 6 shows a flowchart for a method of testing an electrical circuit, according to one or more embodiments of the present disclosure.

FIG. 6 shows a flowchart for a method 600 of testing an electrical circuit, according to one or more embodiments of the present disclosure. The method 600 begins at 602.

At 602, a technician electrically couples a plurality of test leads between a respective plurality of input terminals of a test device and a respective plurality of test points of the electrical circuit. For example, at 602, as shown in FIGS. 3G and 3H, the technician electrically couples the test lead 310*a* to the first terminal 320*a* of the overvoltage protection device array 318, electrically couples the test lead 310*b* to the third terminal 320*c* of the overvoltage protection device array 318, and electrically couples the test lead 310*c* to the second terminal 320*b* of the overvoltage protection device array 318. The method 600 then proceeds to 604.

At 604, the test device measures a first resistance of the first overvoltage protection device array 318. For example, at 604, the switches 112*l* and 112*k* electrically couple the resistance measurement circuit 116*e* to the input terminals 114*a* and 114*c*, either automatically or in response to one or more user inputs as discussed above. The resistance measurement circuit 116*e* then measures a resistance between the input terminals 114*a* and 114*c*, and outputs to the microprocessor 102 a signal or value corresponding to the result. In one or more implementations, the microprocessor 102 provides control signals that cause switches 112 other than the switches 112*l* and 112*k* to be in a nonconductive state. In one or more implementations, the microprocessor 102 causes the display device 118 to display a result of performing the measurement or test. The method 600 then proceeds to 606.

At 606, the test device measures a second resistance of the first overvoltage protection device array 318. For example, at 606, the switches 112*i* and 112*m* electrically couple the resistance measurement circuit 116*e* to the input terminals 114*b* and 114*c*, either automatically or in response to one or more user inputs as discussed above. The resistance measurement circuit 116*e* then measures a resistance between the input terminals 114*b* and 114*c*, and outputs to the microprocessor 102 a signal or value corresponding to the result. In one or more implementations, the microprocessor 102 provides control signals that cause switches 112 other than the switches 112*i* and 112*m* to be in a nonconductive state. In one or more implementations, the microprocessor 102 causes the display device 118 to display a result of performing the measurement or test. The method 600 then proceeds to 608.

In one or more implementations, the method 600 further includes measuring a third resistance of the first overvoltage protection device array 318. For example, the switches 112*l* and 112*m* electrically couple the resistance measurement circuit 116*e* to the input terminals 114*a* and 114*b*, either automatically or in response to one or more user inputs as discussed above. The resistance measurement circuit 116*e* then measures a resistance between the input terminals 114*a* and 114*b*, and outputs to the microprocessor 102 a signal or value corresponding to the result.

At 608, the technician moves remote probes to test a second overvoltage device. For example, at 608, as shown in FIG. 3I, the technician electrically couples the test lead 310*b* to the first terminal 324*a* of the overvoltage protection device 322, and electrically couples the test lead 310*c* to second terminal 324*b* of the overvoltage protection device 322. The method 600 then proceeds to 610.

At 610, the test device measures a voltage of the second overvoltage protection device. For example, at 610, the switches 112*i* and 112*m* electrically couple the resistance measurement circuit 116*e* to the input terminals 114*b* and 114*c*, either automatically or in response to one or more user inputs as discussed above. The resistance measurement circuit 116*e* then measures a resistance between the input terminals 114*b* and 114*c*, and outputs to the microprocessor 102 a signal or value corresponding to the result. In one or more implementations, the microprocessor 102 provides control signals that cause switches 112 other than the switches 112*i* and 112*m* to be in a nonconductive state. In one or more implementations, the microprocessor 102 causes the display device 118 to display a result of performing the measurement or test. The method 600 then ends.

Figure 7:
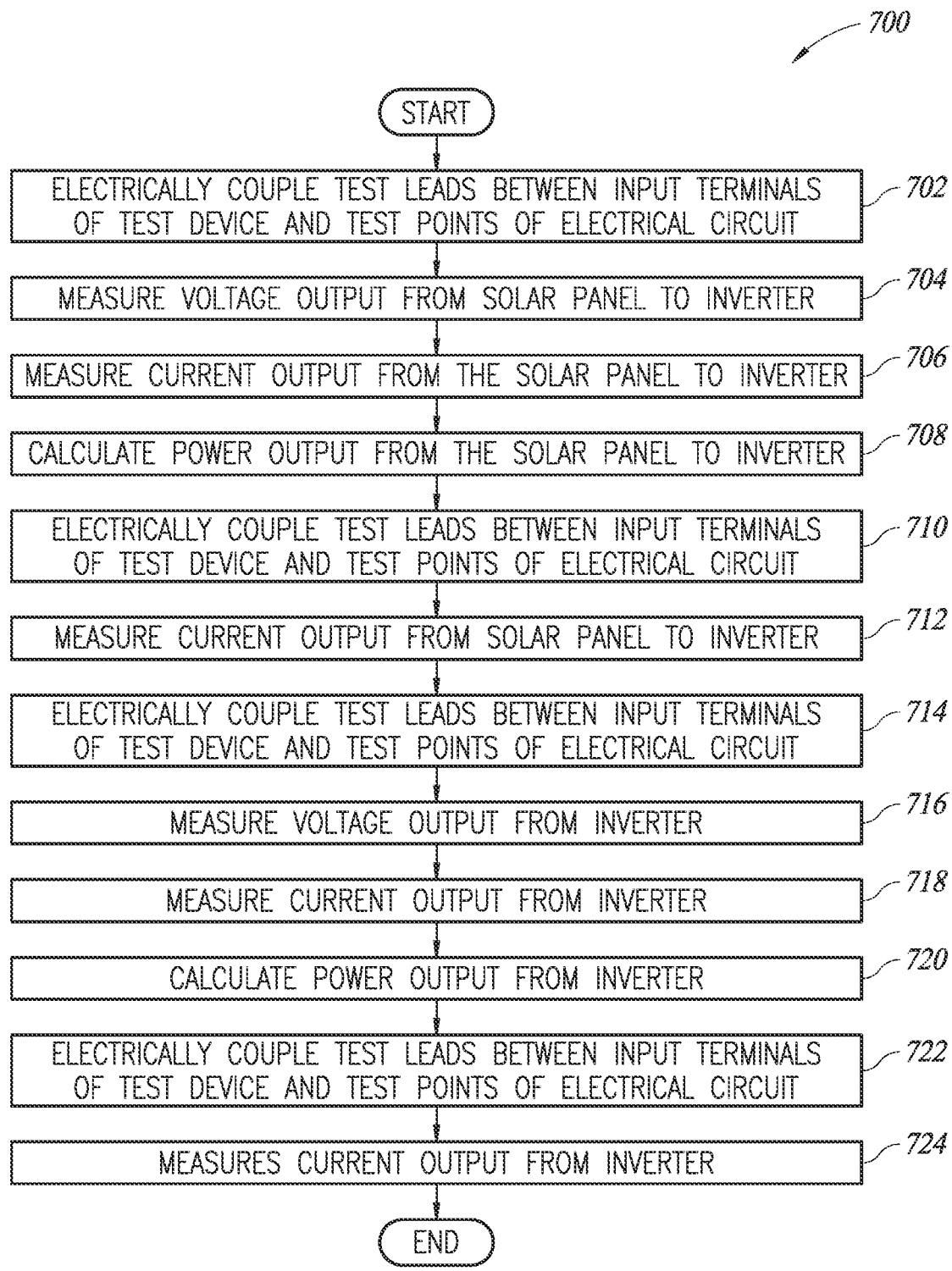
FIG. 7 shows a flowchart for a method of testing an electrical circuit, according to one or more embodiments of the present disclosure.

FIG. 7 shows a flowchart for a method 700 of testing an electrical circuit, according to one or more embodiments of the present disclosure. The method 700 begins at 702.

At 702, a technician electrically couples a plurality of test leads between a respective plurality of input terminals of a test device and a respective plurality of test points of the electrical circuit. For example, at 702, as shown in FIGS. 3J and 3K, the technician electrically couples the first connector of the Y-connector of the test lead 310*a*' to the positive voltage output terminal 304*a*' of the solar panel 302', electrically couples the second connector of the Y-connector of the test lead 310*a*' to the input terminal 114*a* of the test device 100, and electrically couples a connector at the other end of the test lead 310*a*' to the positive DC voltage input terminal 328*a* of the inverter 326. Also, the technician electrically couples the first connector of the Y-connector of the test lead 310*b*' to the negative voltage output terminal 304*b*' of the solar panel 302', electrically couples the second connector of the Y-connector of the test lead 310*b*' to the input terminal 114*b* of the test device 100, and electrically couples a connector at the other end of the test lead 310*b*' to the negative DC voltage input terminal 328*b* of the inverter 326. In addition, the technician places the clamp 330, which is electrically coupled to the test leads 310*c*' and 310*d*', around the test lead 310*b*'.

At 704, the test device measures a voltage output from the solar panel 302' to the inverter 326. For example, at 704, the switches 112*c* and 112*d* electrically couple the DC voltage measurement circuit 116*b* to the input terminals 114*a* and 114*b*, either automatically or in response to one or more user inputs as discussed above. The DC voltage measurement circuit 116*b* then measures a voltage across the input terminals 114*a* and 114*b*, and outputs to the microprocessor 102 a signal or value corresponding to the result. In one or more implementations, the microprocessor 102 provides control signals that cause switches 112 other than the switches 112*c* and 112*d* to be in a nonconductive state. In one or more implementations, the microprocessor 102 causes the display device 118 to display a result of performing the measurement or test. The method 700 then proceeds to 706.

At 706, the test device measures a current output from the solar panel 302' to the inverter 326. For example, at 706, the switches 112*h* and 112*o* electrically couple the DC current measurement circuit 116*d* to the input terminals 114*c* and 114*d*, either automatically or in response to one or more user inputs as discussed above. The DC current measurement circuit 116*d* then measures a current flowing between the input terminals 114*c* and 114*d*, and outputs to the microprocessor 102 a signal or value corresponding to the result. In one or more implementations, the microprocessor 102 provides control signals that cause switches 112 other than the switches 112*h* and 112*o* to be in a nonconductive state. In one or more implementations, the microprocessor 102 causes the display device 118 to display a result of performing the measurement or test. The method 700 then proceeds to 708.

At 708, the test device calculates a power value using the voltage measured at 704 and the current measured at 706. For example, at 708, the microprocessor 102 multiplies the voltage measured at 704 by the current measured at 706. The method 700 then proceeds to 710.

At 710, the technician electrically couples a plurality of test leads between a respective plurality of input terminals of a test device and a respective plurality of test points of the electrical circuit. For example, at 710, as shown in FIG. 3L, the technician electrically couples the cable 332*a* between the positive voltage output terminal 304*a*' of the solar panel 302' and the positive DC voltage input terminal 328*a* of the inverter 326, and electrically couples the cable 332*b* between the negative voltage output terminal 304*b*' of the solar panel 302' and the negative DC voltage input terminal 328*b* of the inverter 326. Also, the technician electrically places the clamp 330 around the cable 332*b*. The method 700 then proceeds to 712.

At 712, the test device measures a current output from the solar panel 302' to the inverter 326. For example, at 712, the switches 112*h* and 112*o* electrically couple the DC current measurement circuit 116*d*, either automatically or in response to one or more user inputs as discussed above. The DC current measurement circuit 116*d* then measures a current flowing between the input terminals 114*c* and 114*d*, and outputs to the microprocessor 102 a signal or value corresponding to the result. In one or more implementations, the microprocessor 102 provides control signals that cause switches 112 other than the switches 112*h* and 112*o* to be in a nonconductive state. In one or more implementations, the microprocessor 102 causes the display device 118 to display a result of performing the measurement or test. The method 700 then proceeds to 714.

At 714, the technician electrically couples a plurality of test leads between a respective plurality of input terminals of a test device and a respective plurality of test points of the electrical circuit. For example, at 714, as shown in FIGS. 3M and 3N, the technician electrically couples the first connector of the Y-connector of the test lead 310*a*' to the second AC voltage output terminal 328*d* of the inverter 326, electrically couples the second connector of the Y-connector of the test lead 310*a*' to the input terminal 114*a* of the test device 100, and electrically couples a connector at the other end of the test lead 310*a*' to a load (not shown). Also, the technician electrically couples the first connector of the Y-connector of the test lead to the first AC voltage output terminal 328*c* of the inverter 326, electrically couples the second connector of the Y-connector of the test lead 310*b*' to the input terminal 114b of the test device 100, and electrically couples a connector at the other end of the test lead 310b' to the load. In addition, the technician places the clamp 330 around the test lead 310b. The method 700 then proceeds to 716.

At 716, the test device measures a voltage output from the inverter 326. For example, at 716, the switches 112a and 112b electrically couple the AC voltage measurement circuit 116a to the input terminals 114a and 114b, either automatically or in response to one or more user inputs as discussed above. The AC voltage measurement circuit 116a then measures a voltage across the input terminals 114a and 114b, and outputs to the microprocessor 102 a signal or value corresponding to the result. In one or more implementations, the microprocessor 102 provides control signals that cause switches 112 other than the switches 112a and 112b to be in a nonconductive state. In one or more implementations, the microprocessor 102 causes the display device 118 to display a result of performing the measurement or test. The method 700 then proceeds to 718.

At 718, the test device measures a current output from the inverter 326. For example, at 718, the switches 112g and 112p electrically couple the AC current measurement circuit 116c to the input terminals 114c and 114d, either automatically or in response to one or more user inputs as discussed above. The AC current measurement circuit 116c then measures a current flowing between the input terminals 114c and 114d, and outputs to the microprocessor 102 a signal or value corresponding to the result. In one or more implementations, the microprocessor 102 provides control signals that cause switches 112 other than the switches 112g and 112p to be in a nonconductive state. In one or more implementations, the microprocessor 102 causes the display device 118 to display a result of performing the measurement or test. The method 700 then proceeds to 720.

At 720, the test device calculates a power value using the voltage measured at 716 and the current measured at 718. For example, at 720, the microprocessor 102 multiplies the voltage measured at 716 by the current measured at 718. The method 700 then proceeds to 722.

At 722, the technician electrically couples a plurality of test leads between a respective plurality of input terminals of a test device and a respective plurality of test points of the electrical circuit. For example, at 722, as shown in FIG. 3O, the technician electrically couples the cable 332a between the first AC voltage output terminal 328c of the inverter 326 and the load, and electrically couples the cable 332b between the second AC voltage output terminal 328d of the inverter 326 and the load. Also, the technician electrically couples the test lead 310c' between the input terminal 114c of the test device 100 and the first terminal of the clamp 330, and electrically couples the test lead 310d' between the input terminal 114d of the test device 100 and the second terminal of the clamp 330. In addition, the technician places the clamp 330 around the cable 332c. The method 700 then proceeds to 724.

At 724, the test device measures a current output from the inverter 326. For example, at 724, the switches 112g and 112p electrically couple the AC current measurement circuit 116c to the input terminals 114c and 114d, either automatically or in response to one or more user inputs as discussed above. The AC current measurement circuit 116c then measures a current flowing between the input terminals 114c and 114d, and outputs to the microprocessor 102 a signal or value corresponding to the result. In one or more implementations, the microprocessor 102 provides control signals that cause switches 112 other than the switches 112g and 112p to be in a nonconductive state. In one or more implementations, the microprocessor 102 causes the display device 118 to display a result of performing the measurement or test. The method 700 then end.

As set forth above, the test device shown in FIG. 1 can be used in the test configurations shown in FIGS. 3A-3O to perform the testing described in FIGS. 4-7. By providing the test device 100 with a set of input terminals 114 that can be electrically coupled using test leads to various test points of the solar installation 300 and remain coupled to the test points of the solar installation 300 while multiple test measurements are made, connection of the test device 100 to the solar installation 300 is simplified compared to conventional testing of solar installations. To enable simplified connection of the test device 100 to the solar installation 300, the microprocessor 102 of the test device 100 may control the switches 112 to electrically couple and decouple respective ones of the input terminals 114 to different ones of the measurement circuits 116 as needed during testing.

A test device for testing an electrical circuit according to the present disclosure may be characterized as including: a plurality of input terminals connectable by test leads to different test points of the electrical circuit; a plurality of measurement circuits, including at least a first measurement circuit and a second measurement circuit; a plurality of switches; at least one processor; and at least one processor-readable storage medium storing instructions that, when executed by the at least one processor, cause the test device to perform a first test of the electrical circuit while one or more switches of the plurality of switches electrically couples at least first and second input terminals of the plurality of input terminals to the first measurement circuit, and perform a second test of the electrical circuit while one or more switches of the plurality of switches electrically couples at least third and fourth input terminals of the plurality of input terminals to the second measurement circuit, wherein the second test is different than the first test, and wherein the first and second tests are performed without changing connections of the plurality of input terminals of the test device to the different test points of the electrical circuit.

The instructions may cause the test device to control the one or more switches of the plurality of switches that electrically couples the at least first and second input terminals of the plurality of input terminals to the first measurement circuit to automatically electrically couple the at least first and second input terminals of the plurality of input terminals to the first measurement circuit to automatically, and control the one or more switches of the plurality of switches that electrically couples the at least third and fourth input terminals of the plurality of input terminals to the second measurement circuit to automatically electrically couple the at least third and fourth input terminals of the plurality of input terminals to the second measurement circuit.

The test device may include a display device, and the instructions may cause the display device to display a message with an instruction to connect one of the test leads to one of the input terminals and to one of the test points test points.

The instructions may cause the test device to cause the one or more switches of the plurality of switches that selectively electrically couples the at least first and second input terminals of the plurality of input terminals to the first measurement circuit to electrically decouple the at least first and second input terminals of the plurality of input terminals from the first measurement circuit after the first test is performed and before the second test is performed.

The instructions may cause the test device to perform a third test of the electrical circuit while one or more switches of the plurality of switches electrically couples the first input terminal and the third input terminal to a third measurement circuit, perform a fourth test of the electrical circuit while one or more switches of the plurality of switches electrically couples the second input terminal and the third input terminal to the third measurement circuit, and perform a fifth test of the electrical circuit while one or more switches of the plurality of switches electrically couples the first input terminal to the second input terminal and to the third measurement circuit, and electrically couples the third input terminal to the third measurement circuit. The third test and the fourth test may be Method 1 tests according to an International Electrotechnical Commission (IEC) 62446-1 standard, and the fifth test may be a Method 2 test according to the IEC 62446-1 standard.

The instructions may cause the test device to perform a third test of the electrical circuit while one or more switches of the plurality of switches electrically couples the first and second input terminals of the plurality of input terminals to a third measurement circuit of the plurality of measurement circuits.

The electrical circuit may include a solar panel, a first one of the input terminals may be configured to be connected to a first output terminal of the solar panel, a second one of the input terminals may be configured to be connected to a second output terminal of the solar panel, a third one of the input terminals may be configured to be connected to a ground or reference potential, and a fourth one of the input terminals may be configured to be connected to a conductive frame of the solar panel.

A method of testing an electrical circuit according to the present disclosure may be characterized as including: prior to testing the electrical circuit, electrically coupling a plurality of test leads between a respective plurality of input terminals of a test device and a respective plurality of test points of the electrical circuit; and performing a plurality of tests of the electrical circuit that includes: selectively coupling a first measurement circuit of the test device to the electrical circuit via a first set of input terminals and test leads and performing a first test of the electrical circuit, and selectively coupling a second measurement circuit of the test device to the electrical circuit via a second set of input terminals and test leads and performing a second test of the electrical circuit, where the second test is different than the first test, the second set of input terminals and test leads is different than the first set of input terminals and test leads, and the first and second tests are performed without changing the coupling of the plurality of test leads between the test device and the electrical circuit.

The selectively coupling the first measurement circuit of the test device to the electrical circuit via the first set of input terminals and test leads may include automatically coupling the first measurement circuit of the test device to the electrical circuit via the first set of input terminals and test leads, and the selectively coupling the second measurement circuit of the test device to the electrical circuit via the second set of input terminals and test leads may include automatically coupling the second measurement circuit of the test device to the electrical circuit via the second set of input terminals and test leads.

The method may further include: electrically decoupling the first measurement circuit of the test device from the electrical circuit via the first set of input terminals and test leads; and selectively coupling a third measurement circuit of the test device to the electrical circuit via the first set of input terminals and test leads and performing a third test of the electrical circuit.

The first set of input terminals may include a first input terminal and a second input terminal, the second set of input terminals may include a third input terminal and a fourth input terminal, the method may further include: selectively coupling a third measurement circuit of the test device to the electrical circuit the first input terminal and the third input terminal and performing a third test of the electrical circuit, selectively coupling the third measurement circuit of the test device to the electrical circuit the second input terminal and the third input terminal and performing a fourth test of the electrical circuit, and selectively coupling the first input terminal to the second input terminal and to the third measurement circuit, and selectively coupling the third input terminal and to the third measurement circuit and performing a fifth test of the electrical circuit. The third test and the fourth test may Method 1 tests according to an International Electrotechnical Commission (IEC) 62446-1 standard, and the fifth test may be a Method 2 test according to the IEC 62446-1 standard.

The method may further include electrically coupling a first one of the input terminals to a second one of the input terminals.

The electrical circuit may include a solar panel, the test points may include a first test point, a second test point, a third test point, and fourth test point, the first test point may be a positive output terminal the of the solar panel, the second test point may be a negative output terminal the of the solar panel, the third test point may be a ground or reference potential electrically coupled to the solar panel, and the fourth test point of the electrical circuit may be a conductive frame of the of the solar panel.

A system for testing an electrical circuit according to the present disclosure may be characterized as including a plurality of test leads, including at least a first test lead, a second test lead, a third test lead, and a fourth test lead that are each connectable to different test points of the electrical circuit; and a test device including: a plurality of input terminals, including at least a first input terminal configured to receive the first test lead, a second input terminal configured to receive the second test lead, a third input terminal configured to receive the third test lead, and a fourth input terminal configured to receive the fourth test lead; a plurality of measurement circuits, including at least a first measurement circuit and a second measurement circuit; a plurality of switches; and at least one processor configured to: perform a first test of the electrical circuit while one or more switches of the plurality of switches electrically couples the first input terminal and the second input terminal to the first measurement circuit, and perform a second test of the electrical circuit while one or more switches of the plurality of switches electrically couples the third input terminal and the fourth input terminal to the second measurement circuit, wherein the second test is different than the first test, and the first and second tests are performed without changing connections of the plurality of test leads to the plurality of input terminals of the test device and the different test points of the electrical circuit.

The at least one processor may be further configured to: control one or more switches of the plurality of switches to automatically electrically couple the first input terminal and the second input terminal to the first measurement circuit, and control one or more switches of the plurality of switches to automatically electrically couple the third input terminal and the fourth input terminal to the second measurement circuit.

The at least one processor may be further configured to: after the first test is performed and before the second test is performed, control one or more switches of the plurality of switches to electrically decouple the at least first and second input terminals of the plurality of input terminals from the first measurement circuit.

The plurality of measurement circuits may include a third measurement circuit, and the instructions stored by the storage medium, when executed by the at least one processor, may cause the test device to: perform a third test of the electrical circuit while one or more switches of the plurality of switches electrically couples the first input terminal and the third input terminal to the third measurement circuit, perform a fourth test of the electrical circuit while one or more switches of the plurality of switches electrically couples the second input terminal and the third input terminal to the third measurement circuit, and perform a fifth test of the electrical circuit while one or more switches of the plurality of switches electrically couples the first input terminal to the second input terminal and to the third measurement circuit, and electrically couples the third input terminal to the third measurement circuit. The third test and the fourth test may be Method 1 tests according to an International Electrotechnical Commission (IEC) 62446-1 standard, and the fifth test may be a Method 2 test according to the IEC 62446-1 standard.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A test device for testing an electrical circuit of a solar panel, the test device comprising:
a plurality of input terminals connectable by test leads to different test points of the electrical circuit, wherein a first one of the input terminals is configured to be connected to a first output terminal of the solar panel, wherein a second one of the input terminals is configured to be connected to a second output terminal of the solar panel, wherein a third one of the input terminals is configured to be connected to a ground or reference potential, and wherein a fourth one of the input terminals is configured to be connected to a conductive frame of the solar panel;
a plurality of measurement circuits, including at least a first measurement circuit and a second measurement circuit;
a plurality of switches;
at least one processor; and
at least one processor-readable storage medium storing instructions that, when executed by the at least one processor, cause the test device to:
perform a first test of the electrical circuit while one or more switches of the plurality of switches electrically couples a first set of the plurality of input terminals to the first measurement circuit, and
perform a second test of the electrical circuit while one or more switches of the plurality of switches electrically couples a second set of the plurality of input terminals to the second measurement circuit, wherein the second test is different than the first test, and wherein the first and second tests are performed without changing connections of the plurality of input terminals of the test device to the different test points of the electrical circuit.

2. The test device according to claim 1 wherein the instructions stored by the storage medium, when executed by the at least one processor, cause the test device to:
control the one or more switches of the plurality of switches that electrically couples the first set of the plurality of input terminals to the first measurement circuit to automatically electrically couple the first set of the plurality of input terminals to the first measurement circuit, and
control the one or more switches of the plurality of switches that electrically couples the second set of the plurality of input terminals to the second measurement circuit to automatically electrically couple the second set of the plurality of input terminals to the second measurement circuit.

3. The test device according to claim 1, further comprising:
a display device,
wherein the instructions stored by the storage medium, when executed by the at least one processor, cause the display device to display a message with an instruction to connect one of the test leads to one of the input terminals and to one of the different test points.

4. The test device according to claim 1 wherein the instructions stored by the storage medium, when executed by the at least one processor, cause the test device to:
after the first test is performed and before the second test is performed, cause the one or more switches of the plurality of switches that selectively electrically couples the first set of the plurality of input terminals to the first measurement circuit to electrically decouple the first set of the plurality of input terminals from the first measurement circuit.

5. The test device according to claim 1 wherein the instructions stored by the storage medium, when executed by the at least one processor, cause the test device to:
perform a third test of the electrical circuit while one or more switches of the plurality of switches electrically couples a first one of the input terminals and the third one of the input terminals to a third measurement circuit,
perform a fourth test of the electrical circuit while one or more switches of the plurality of switches electrically couples a second one of the input terminals and the third one of the input terminals to the third measurement circuit, and
perform a fifth test of the electrical circuit while one or more switches of the plurality of switches electrically couples the first one of the input terminals to the second one of the input terminals and to the third measurement circuit, and electrically couples the third one of the input terminals to the third measurement circuit.

6. The test device according to claim 5 wherein:
the third test and the fourth test are Method 1 tests according to an International Electrotechnical Commission (IEC) 62446-1 standard, and the fifth test is a Method 2 test according to the IEC 62446-1 standard.

7. The test device according to claim 1, further comprising:
perform a third test of the electrical circuit while one or more switches of the plurality of switches electrically couples the first set of the plurality of input terminals to a third measurement circuit of the plurality of measurement circuits.

8. A method of testing an electrical circuit of a solar panel, the method comprising:
prior to testing the electrical circuit, electrically coupling a plurality of test leads between a respective plurality of input terminals of a test device and a respective plurality of test points of the electrical circuit; and
performing a plurality of tests of the electrical circuit that includes:
selectively coupling a first measurement circuit of the test device to the electrical circuit via a first set of input terminals and test leads and performing a first test of the electrical circuit, and
selectively coupling a second measurement circuit of the test device to the electrical circuit via a second set of input terminals and test leads and performing a second test of the electrical circuit,
wherein:
the second test is different than the first test;
the second set of input terminals and test leads is different than the first set of input terminals and test leads;
the first and second tests are performed without changing the coupling of the plurality of test leads between the test device and the electrical circuit;
the test points include a first test point, a second test point, a third test point, and a fourth test point;
the first test point is a positive output terminal of the solar panel;
the second test point is a negative output terminal of the solar panel;
the third test point is a ground or reference potential electrically coupled to the solar panel; and
the fourth test point of the electrical circuit is a conductive frame of the solar panel.

9. The method of testing according to claim 8 wherein:
the selectively coupling the first measurement circuit of the test device to the electrical circuit via the first set of input terminals and test leads includes automatically coupling the first measurement circuit of the test device to the electrical circuit via the first set of input terminals and test leads, and
the selectively coupling the second measurement circuit of the test device to the electrical circuit via the second set of input terminals and test leads includes automatically coupling the second measurement circuit of the test device to the electrical circuit via the second set of input terminals and test leads.

10. The method-a of testing according to claim 8, further comprising:
electrically decoupling the first measurement circuit of the test device from the electrical circuit via the first set of input terminals and test leads; and
selectively coupling a third measurement circuit of the test device to the electrical circuit via the first set of input terminals and test leads and performing a third test of the electrical circuit.

11. The method of testing according to claim 8 wherein:
the first set of input terminals includes a first input terminal and a second input terminal,
the second set of input terminals includes a third input terminal and a fourth input terminal, and
the method further includes:
selectively coupling a third measurement circuit of the test device to the electrical circuit the first input terminal, and the third input terminal, and performing a third test of the electrical circuit,
selectively coupling the third measurement circuit of the test device to the electrical circuit, the second input terminal, and the third input terminal, and performing a fourth test of the electrical circuit, and
selectively coupling the first input terminal to the second input terminal and to the third measurement circuit, and selectively coupling the third input terminal and to the third measurement circuit and performing a fifth test of the electrical circuit.

12. The method of testing according to claim 11 wherein:
the third test and the fourth test are Method 1 tests according to an International Electrotechnical Commission (IEC) 62446-1 standard, and
the fifth test is a Method 2 test according to the IEC 62446-1 standard.

13. The method of testing according to claim 8, further comprising:
electrically coupling a first one of the input terminals to a second one of the input terminals.

14. A system for testing an electrical circuit, the system comprising:
a plurality of test leads, including at least a first test lead, a second test lead, a third test lead, and a fourth test lead that are each connectable to different test points of the electrical circuit; and
a test device including:
a plurality of input terminals, including at least a first input terminal configured to receive the first test lead, a second input terminal configured to receive the second test lead, a third input terminal configured to receive the third test lead, and a fourth input terminal configured to receive the fourth test lead;
a plurality of measurement circuits, including at least a first measurement circuit, a second measurement circuit, and a third measurement circuit;
a plurality of switches; and
at least one processor configured to:
perform a first test of the electrical circuit while one or more switches of the plurality of switches electrically couples the first input terminal and the second input terminal to the first measurement circuit,
perform a second test of the electrical circuit while one or more switches of the plurality of switches electrically couples the third input terminal and the fourth input terminal to the second measurement circuit, wherein the second test is different than the first test, and the first and second tests are performed without changing connections of the plurality of test leads to the plurality of input terminals of the test device and the different test points of the electrical circuit,
perform a third test of the electrical circuit while one or more switches of the plurality of switches electrically couples the first input terminal and the third input terminal to the third measurement circuit, perform a fourth test of the electrical circuit while one or more switches of the plurality of switches electrically couples the second input terminal and the third input terminal to the third measurement circuit, and perform a fifth test of the electrical circuit while one or more switches of the plurality of switches electrically couples the first input terminal to the second input terminal and to the third measurement circuit, and electrically couples the third input terminal to the third measurement circuit.

15. The system according to claim 14 wherein the at least one processor is further configured to:

control one or more switches of the plurality of switches to automatically electrically couple the first input terminal and the second input terminal to the first measurement circuit, and control one or more switches of the plurality of switches to automatically electrically couple the third input terminal and the fourth input terminal to the second measurement circuit.

16. The system according to claim 14 wherein the at least one processor is further configured to:

after the first test is performed and before the second test is performed, control one or more switches of the plurality of switches to electrically decouple the at least first and second input terminals of the plurality of input terminals from the first measurement circuit.

17. The system according to claim 14 wherein:

the third test and the fourth test are Method 1 tests according to an International Electrotechnical Commission (IEC) 62446-1 standard, and the fifth test is a Method 2 test according to the IEC 62446-1 standard.

\* \* \* \* \*

UNITED STATES PATENT AND TRADEMARK OFFICE
CERTIFICATE OF CORRECTION

PATENT NO. : 11,768,242 B1
APPLICATION NO. : 18/072580
DATED : September 26, 2023
INVENTOR(S) : Ulrich Boecherer Page 1 of 1

It is certified that error appears in the above-identified patent and that said Letters Patent is hereby corrected as shown below:

In the Claims

<u>Column 24, Claim 11, Line 7:</u>
"electrical circuit the first input" should read: --electrical circuit, the first input--.

Signed and Sealed this
Twenty-fifth Day of March, 2025

Coke Morgan Stewart
*Acting Director of the United States Patent and Trademark Office*